United States Patent [19]

Porterfield et al.

[11] Patent Number: 4,769,904

[45] Date of Patent: Sep. 13, 1988

[54] METHOD AND APPARATUS FOR HANDLING LEADED AND LEADLESS SURFACE MOUNTABLE COMPONENTS

[75] Inventors: Richard Porterfield, Chenango Bridge; Stanley W. Janisiewicz, Endwell; Weibley J. Dean, Binghamton, all of N.Y.; Douglas A. Biesecker, Clark Summit, Pa.; Steven Pert, Johnson City, N.Y.

[73] Assignee: Universal Instruments Corporation, Binghamton, N.Y.

[21] Appl. No.: 52,130

[22] Filed: May 11, 1987

Related U.S. Application Data

[63] Continuation of Ser. No. 761,762, Aug. 2, 1985, abandoned.

[51] Int. Cl.⁴ .......................... H05K 3/34; B23P 19/00
[52] U.S. Cl. ........................................ 29/840; 29/740; 414/225
[58] Field of Search ................ 29/740, 739, 741, 759; 414/223, 225, 737

[56] References Cited

U.S. PATENT DOCUMENTS

| | | | |
|---|---|---|---|
| 4,290,732 | 9/1982 | Taki et al. | 29/740 X |
| 4,372,802 | 2/1983 | Harigane et al. | 29/740 X |
| 4,437,232 | 3/1984 | Araki et al. | 29/740 X |
| 4,473,247 | 9/1984 | Itemadani et al. | 29/740 X |
| 4,529,353 | 7/1985 | Dean et al. | 414/225 X |

FOREIGN PATENT DOCUMENTS

2140716 12/1984 United Kingdom ................ 29/740

*Primary Examiner*—Howard N. Goldberg
*Assistant Examiner*—Carl J. Arbes
*Attorney, Agent, or Firm*—Franklin D. Wolffe; Morris Fidelman

[57] ABSTRACT

The present invention involves a method and apparatus for sequencing leadless and leaded surface mountable components, feeding them directly from a sequencer to chip placement heads, and placing them at selected locations on a circuit board. The chip carriers of an endless chain conveyor carry each component of the sequence of components to a chip placement head. Direct supply from a sequencer having the chip carriers and a series of individual programmably controlled dispenser heads provides for quick and flexible variation of the input sequence without manual intervention. A plurality of the chip placement heads are mounted on a turret assembly to facilitate continuous unloading of the chip carriers and orienting, centering, and squaring of the components prior to placement on a circuit board.

22 Claims, 26 Drawing Sheets

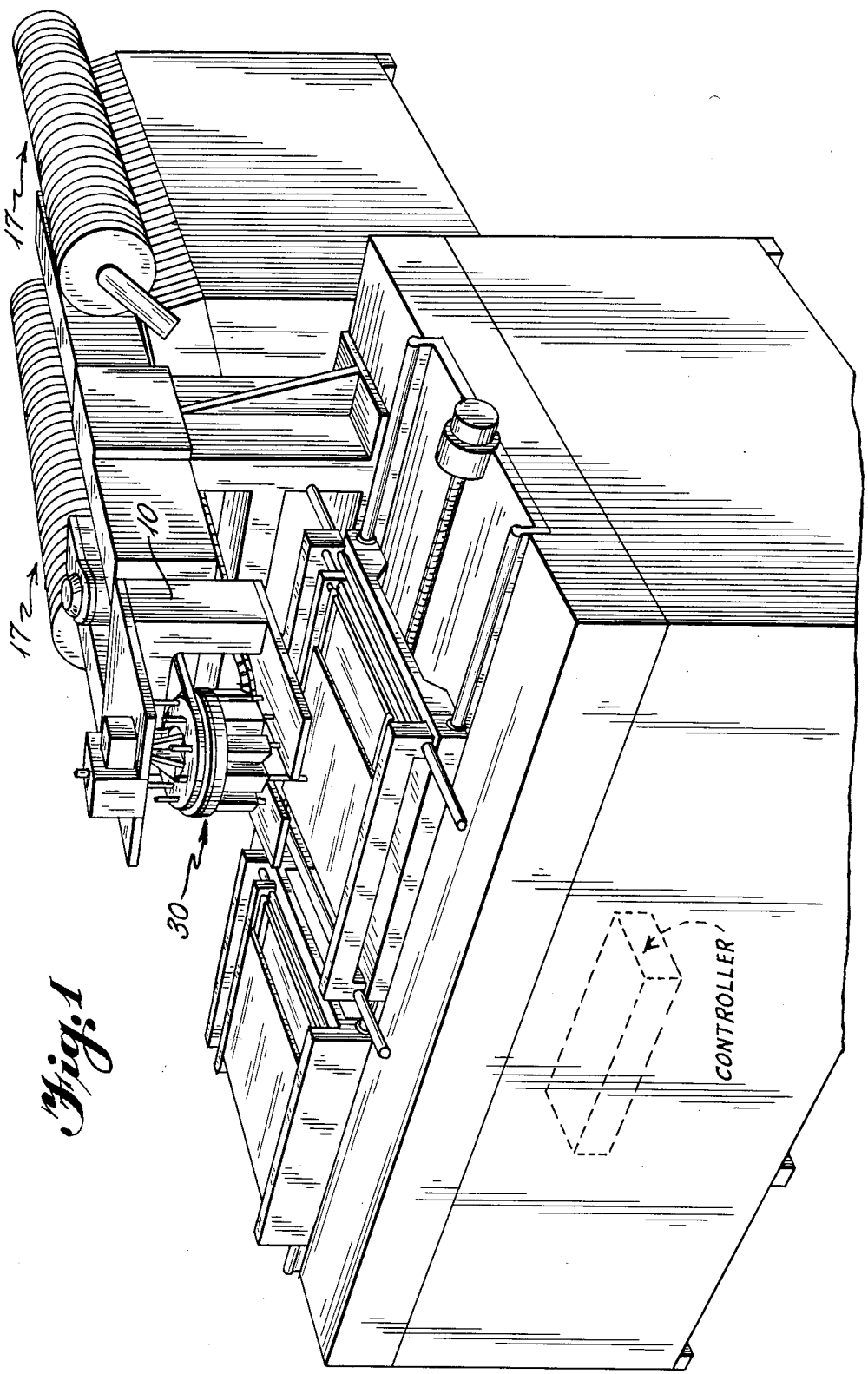

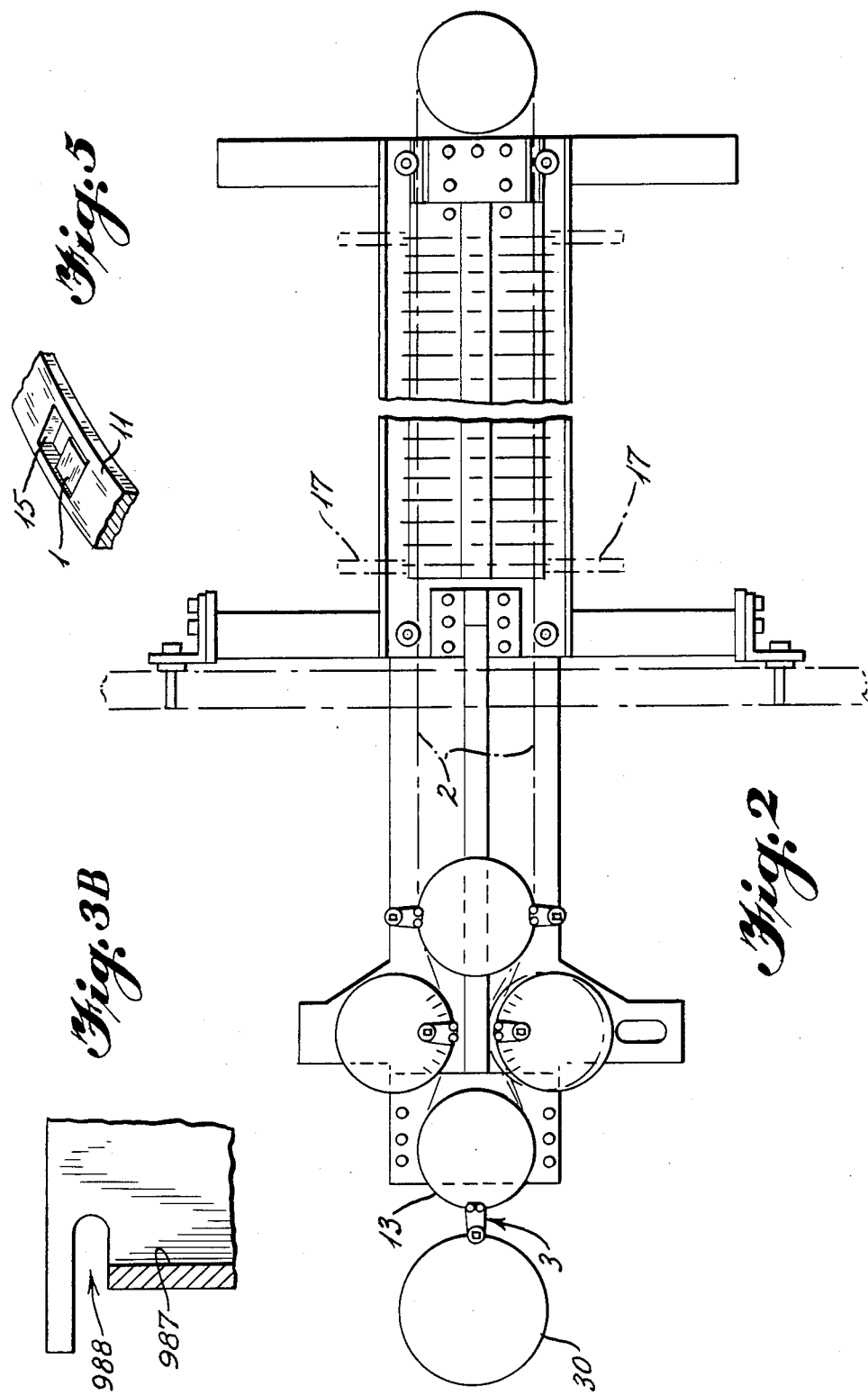

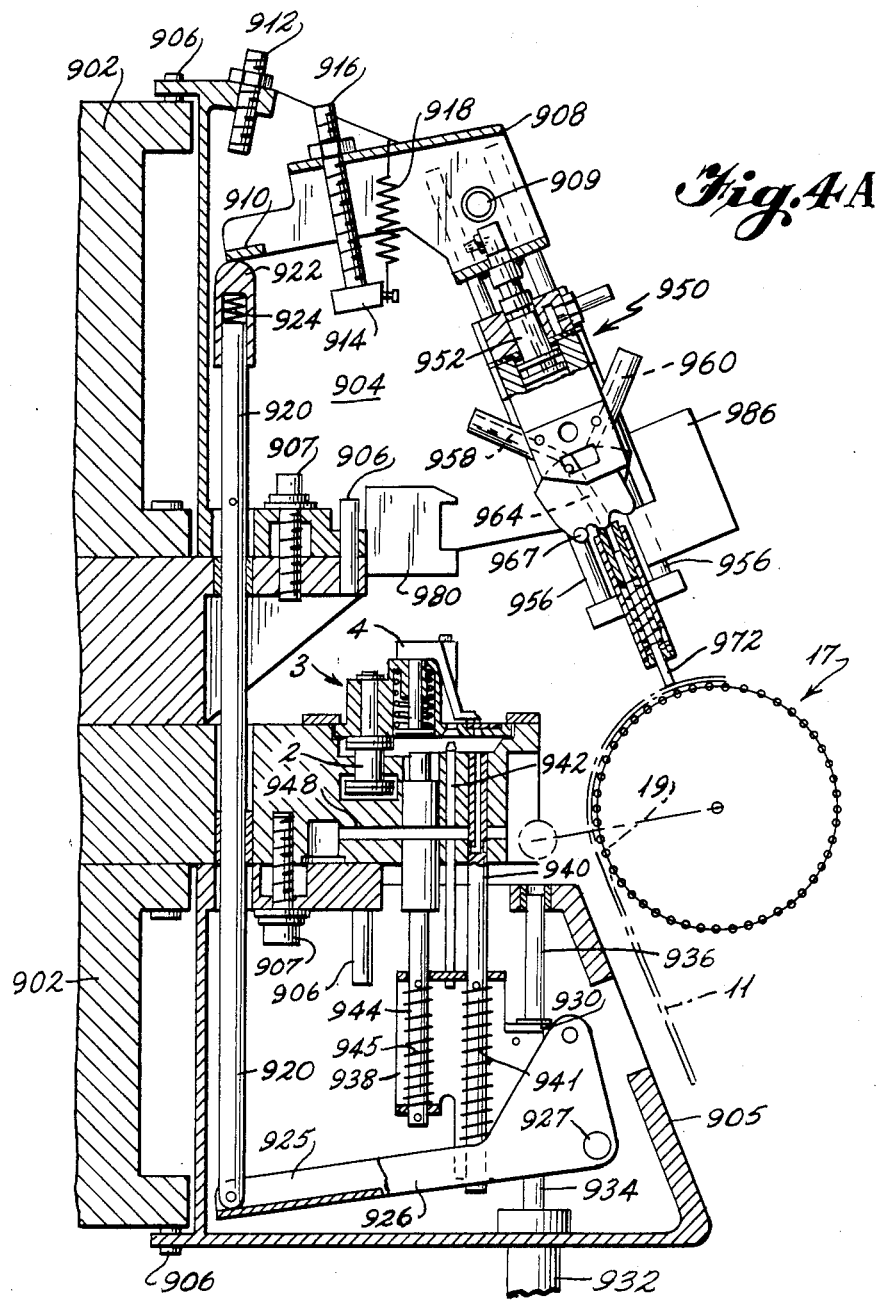

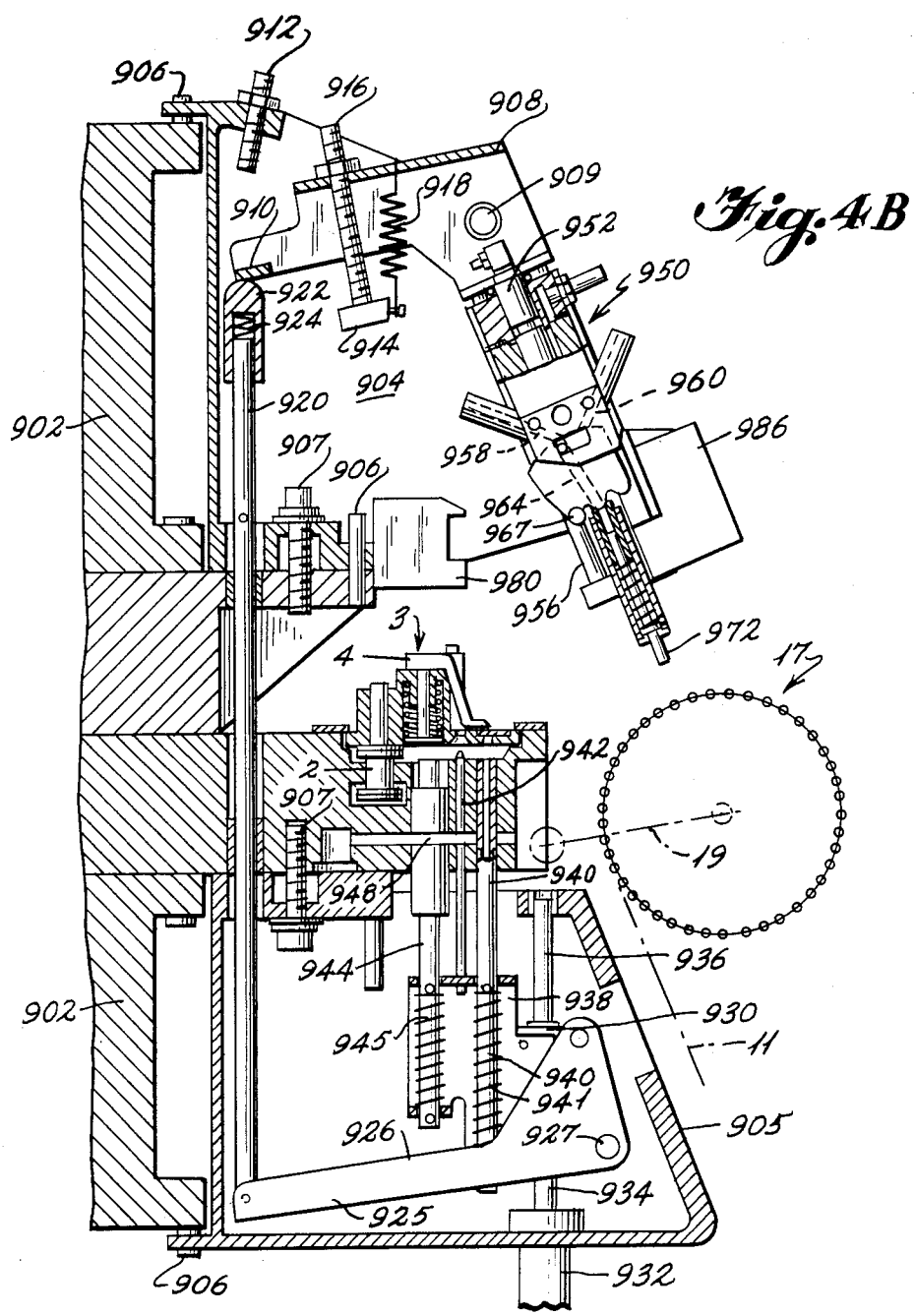

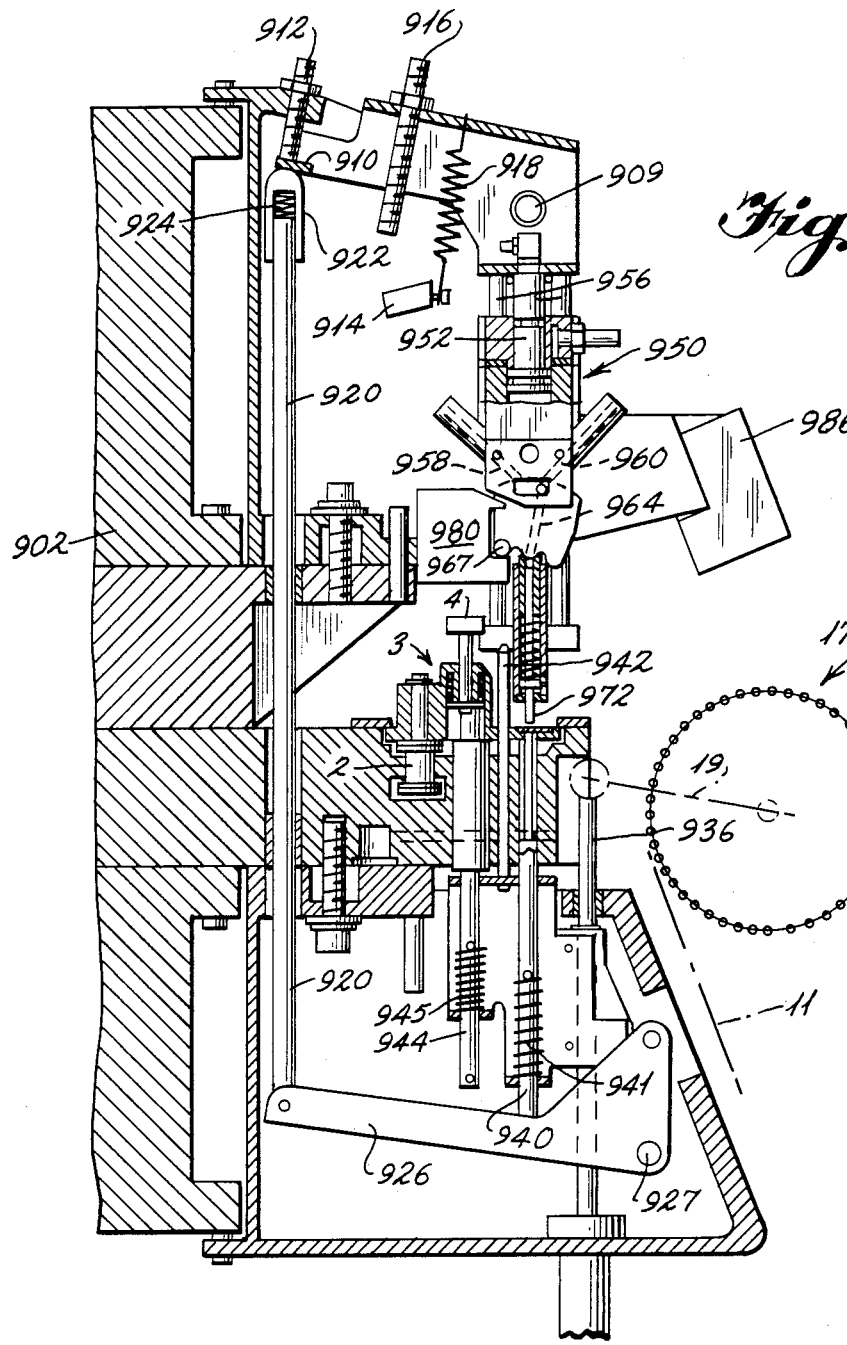

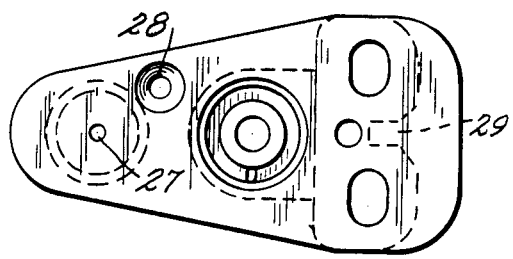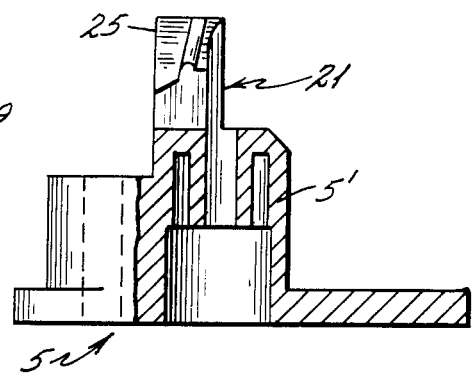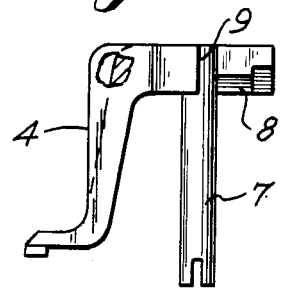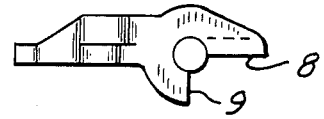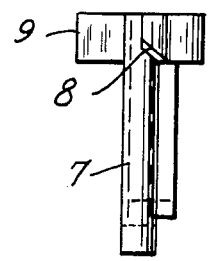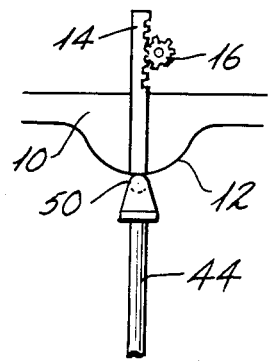

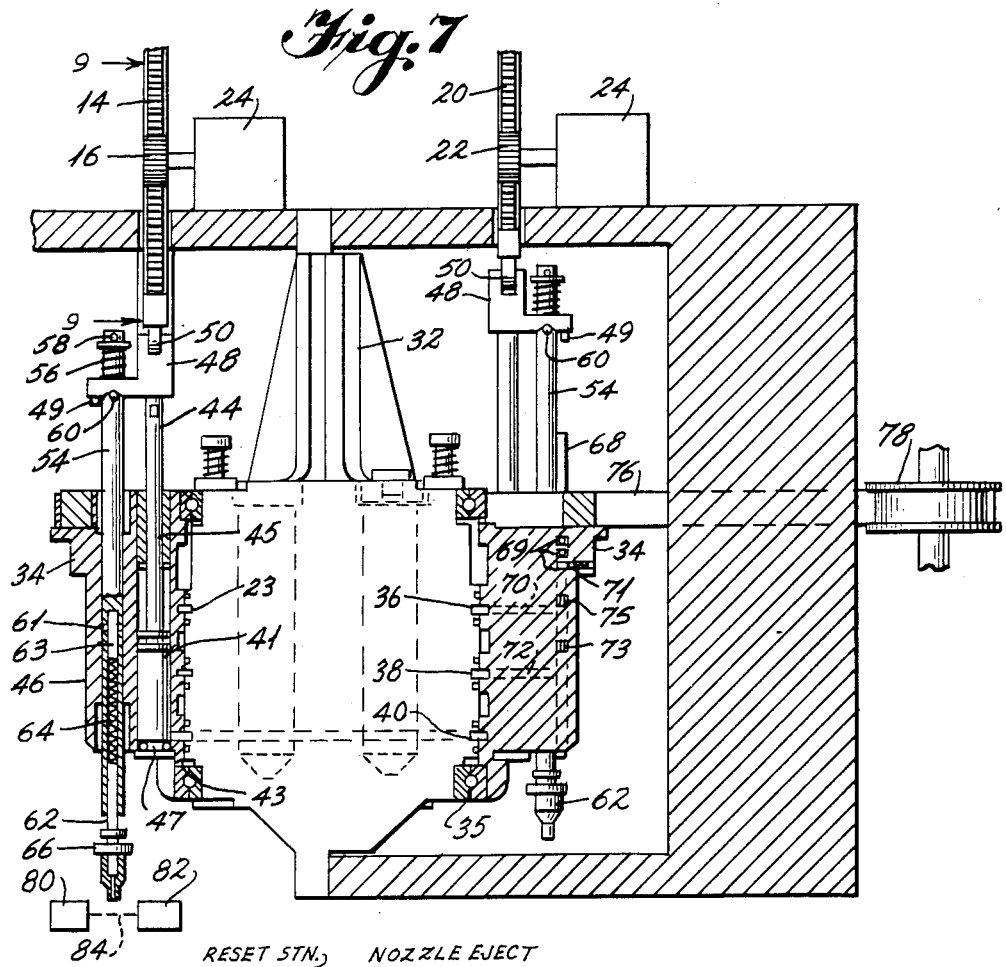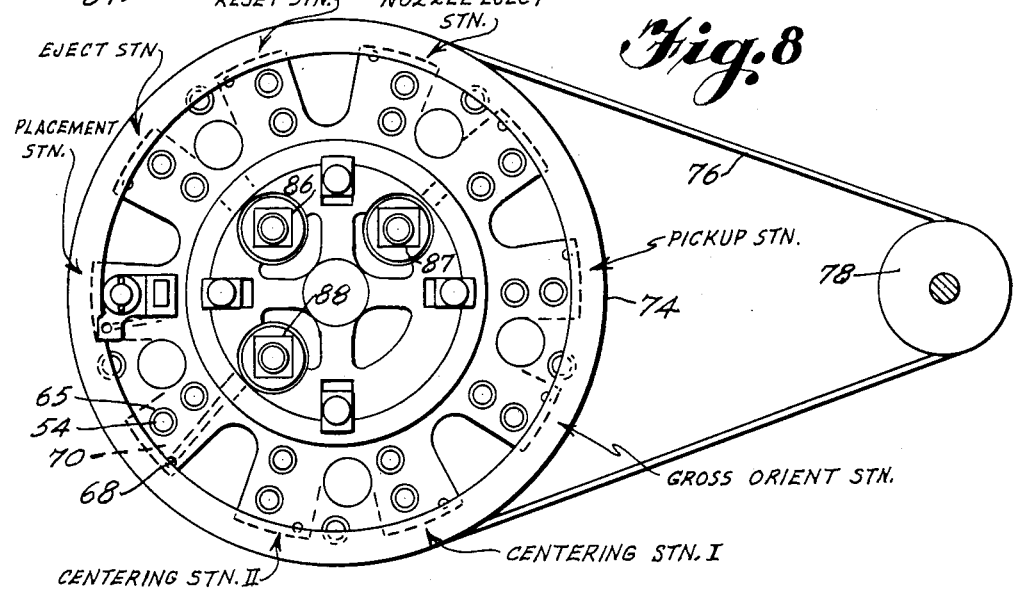

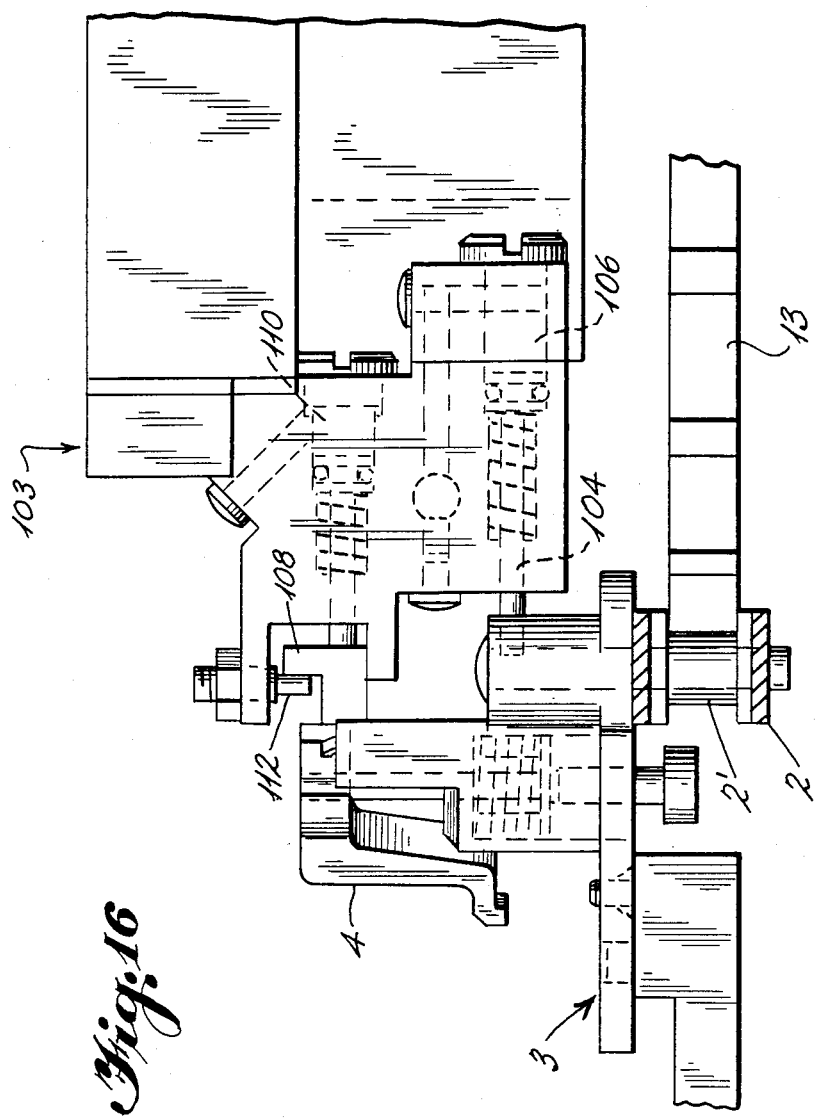

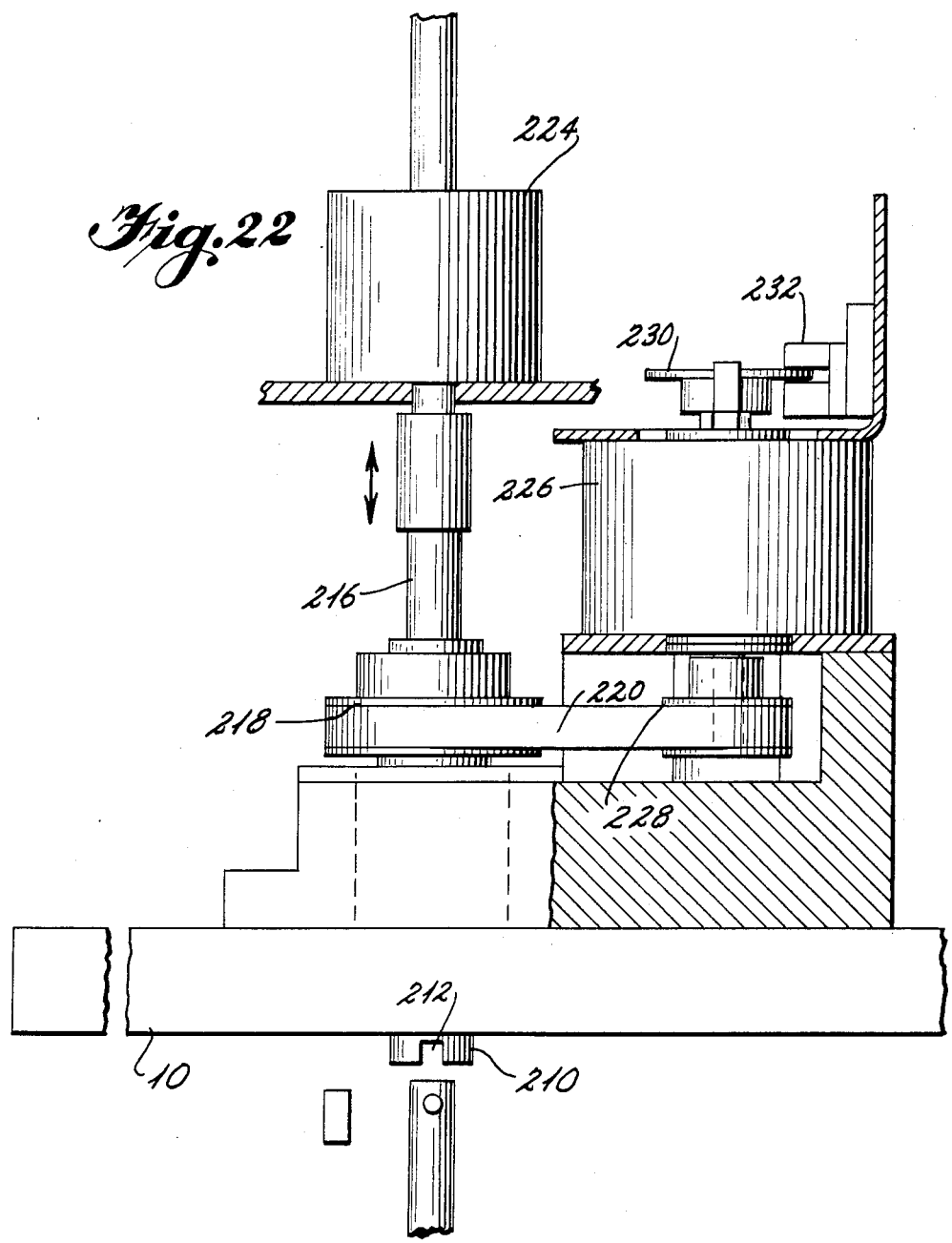

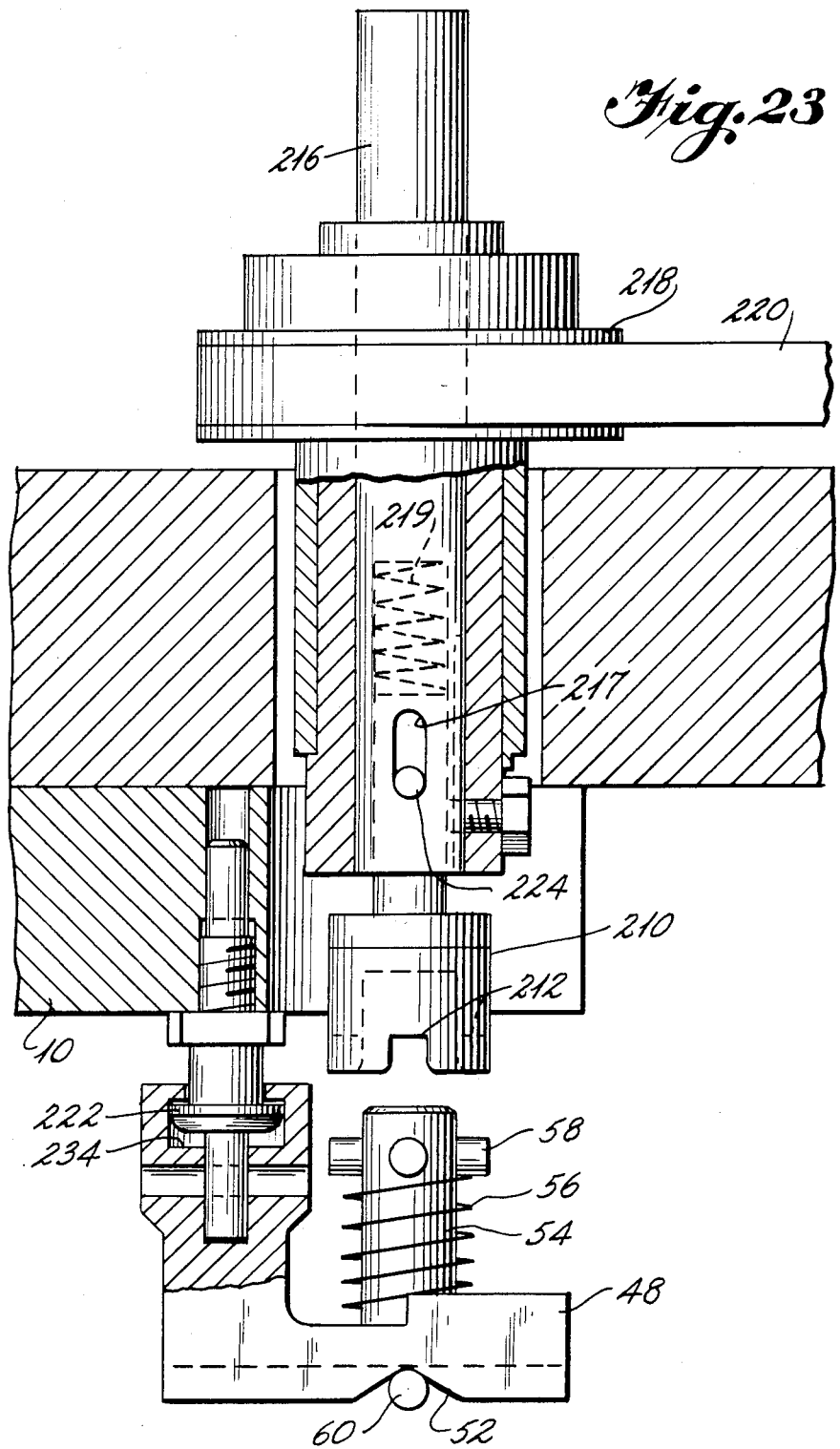

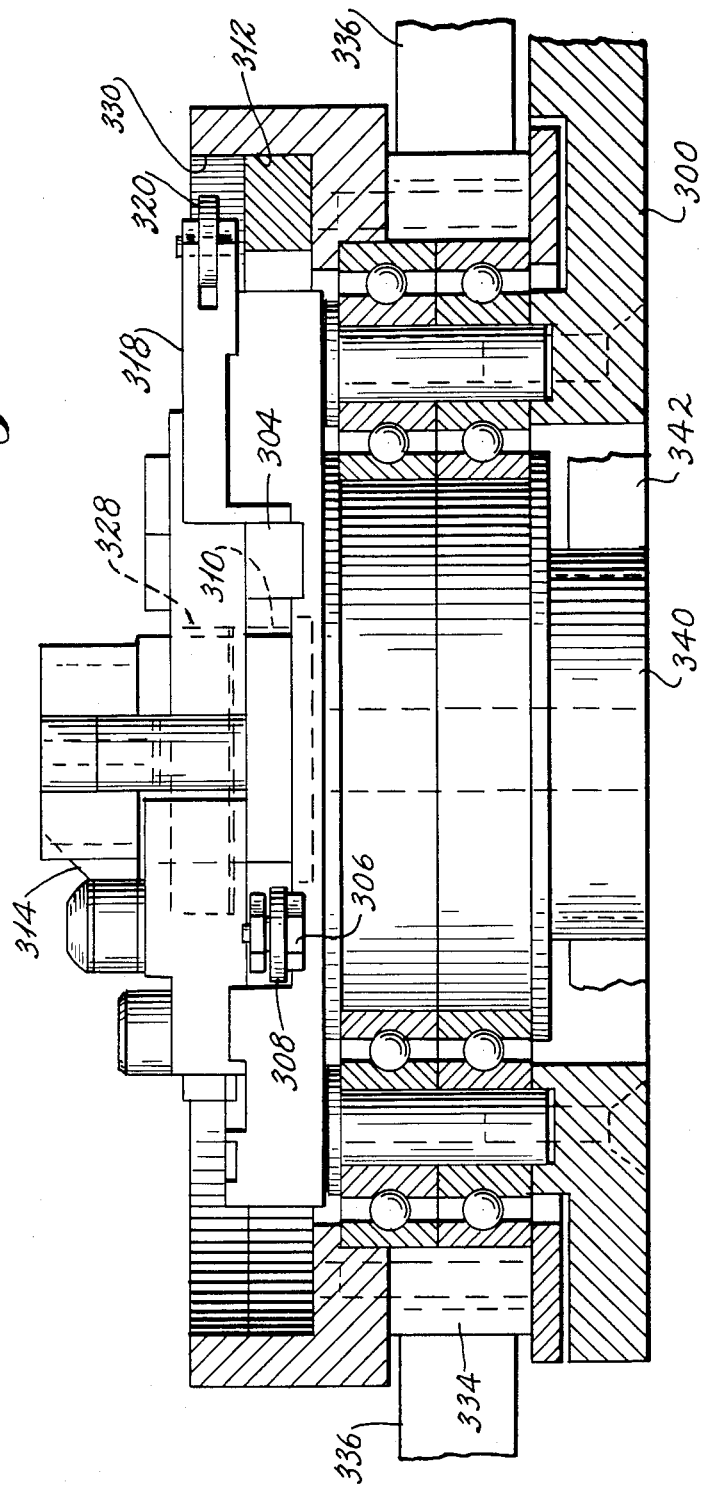

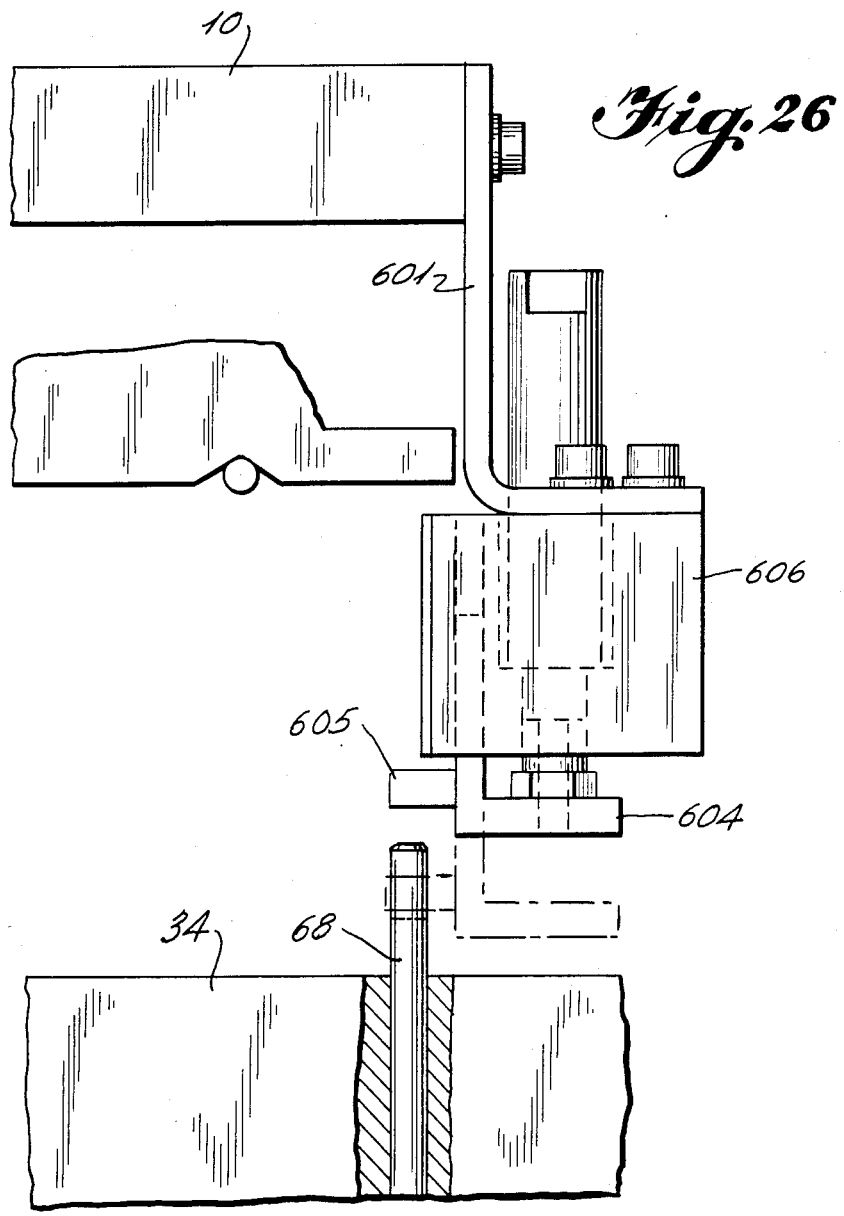

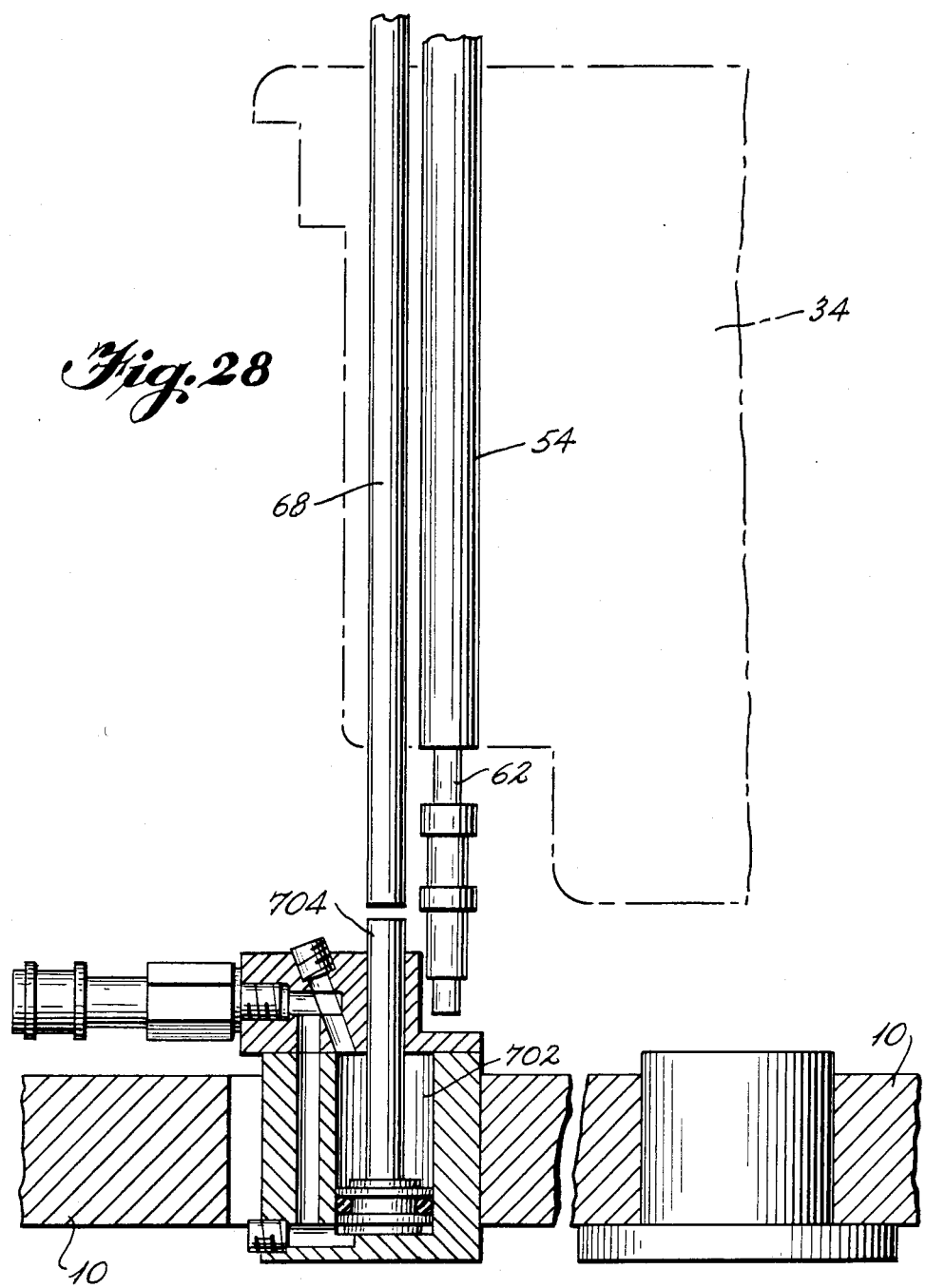

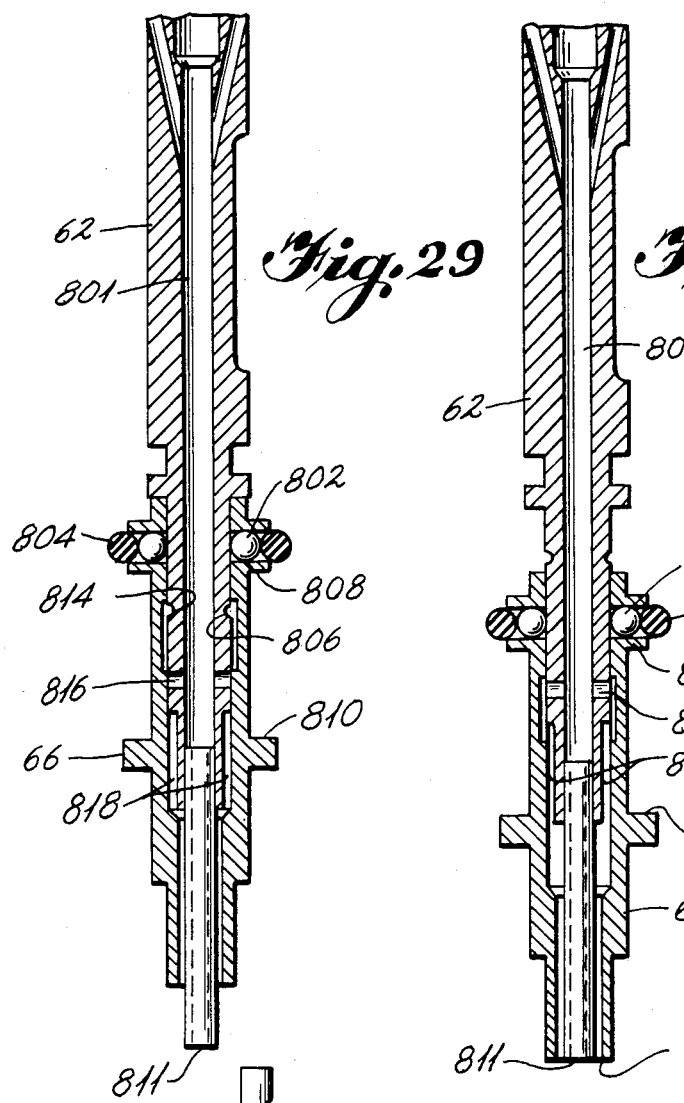
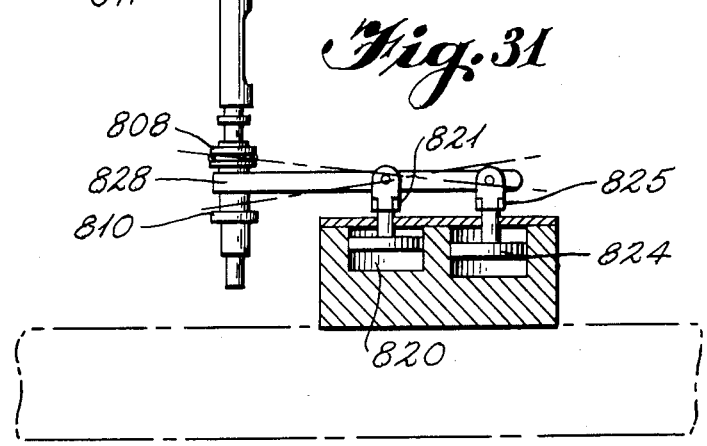

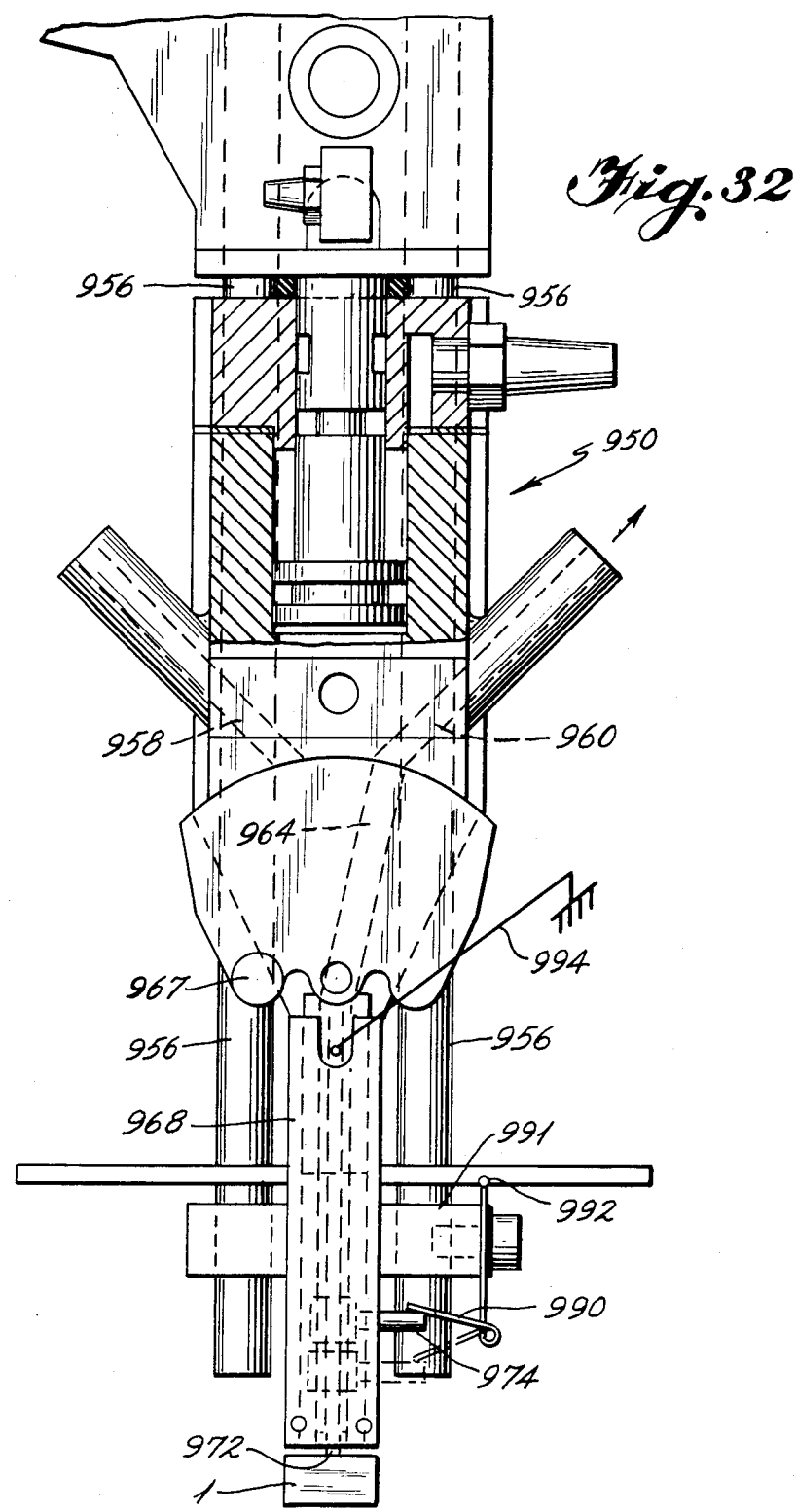

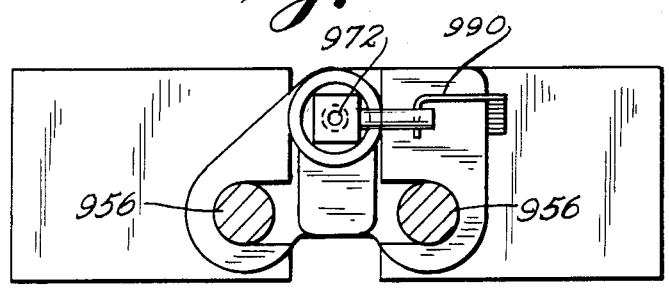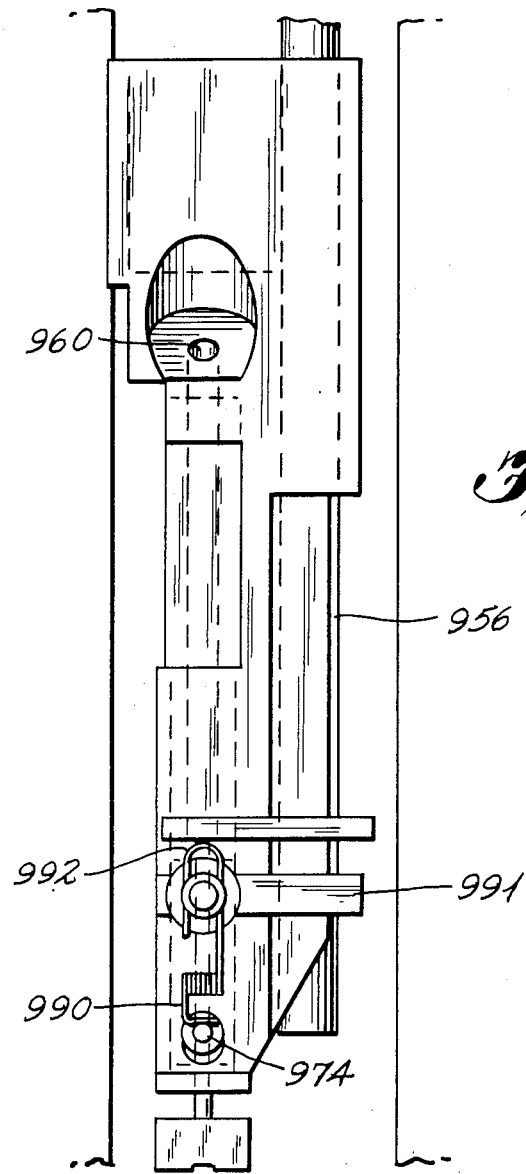

METHOD AND APPARATUS FOR HANDLING LEADED AND LEADLESS SURFACE MOUNTABLE COMPONENTS

This application is a continuation of application Ser. No. 761,762, filed Aug. 2, 1985, now abandoned.

CROSS REFERENCES TO THE PRIOR ART

U.S. Pat. No. 4,520,557 - APPARATUS FOR MOUNTING CHIP TYPE CIRCUIT ELEMENTS ON PRINTED CIRCUIT BOARDS -issued to Harigane, et al. on June 4, 1985.

Japanese Patent Disclosure (Kokai) No. 59-198800 -MULTIHEAD PARTS MOUNTING APPARATUS - Arima, et al., Laid Open Nov. 10, 1984.

U.S. Pat. No. 4,398,658 - HIGH SPEED RADIAL LEAD COMPONENT SEQUENCING AND INSERTING MACHINE - issued to Synder, et al. on Aug. 16, 1983.

U.S. Pat. No. 4,458,412 - LEADLESS CHIP PLACEMENT MACHINE FOR PRINTED CIRCUIT BOARDS - issued to Dean, et al. on July 10, 1984.

BACKGROUND AND SUMMARY OF THE INVENTION

The invention is directed to a method and apparatus for handling electrical components and particularly to selecting and fetching leadless and leaded surface mountable electrical components in a particular sequence and to mounting the sequenced components on a printed circuit board (PCB) automatedly in a chip placement process.

Chip placement generally involves surface mounting of miniature components, without the need for lead receiving holes at the mounting locations of the circuit board and usually by using a dot of glue to hold the component on the circuit board in preparation for subsequent soldering of electrical connectors of the component to the electrical tracks. The thickness of these surface mounted components generally range from 0.018-0.062 inches, with width and length dimensions perpendicular to the thickness generally ranging from 0.040-0.250 inches. The electrical connectors of surface mountable components may comprise: conductive pads which are generally flush with the component body; hemispherical-shaped conductive balls; and/or conductive leads protruding from the body. The tips of the protruding conductive leads may extend past or be generally flush with a surface of the component body which is adjacent and generally parallel to the circuit board top surface when mounted.

Accordingly, it is an object of this invention to provide a method and apparatus for increasing the population capacities and speeds of chip placement machines while providing for handling of surface mountable components of the type having leads, as well as the leadless type.

Another object of the invention is to provide a method and apparatus for detecting a defect at a placement station wherein a component is missing, tilted, or an incorrect thickness and performing a high speed repair function to replace the particular component while the circuit board is still at the placement station.

An additional object of the invention is to provide an improved chip carrier which is spring mounted to a conveyor chain for alignment positioning relative to and parallel to the direction of the path of travel of the conveyor. The chip carrier is provided with a clamp arm for holding the component on a pad thereof without interfering with any leads which the component may have, and the pad is porous to facilitate negative and positive air pressures, respectively, for holding the component on and displacing the component from the pad selectively.

These and other objects and advantages of the present invention will be more clearly understood by reference to the following description and drawings.

The present invention involves a method and apparatus for feeding leadless and leaded surface mountable components directly from a sequencer to a chip placement head. An endless chain conveyor carries the sequence of components to a chip placement head via a series of chip carriers, each chip carrier having negative air supplied thereto during loading to hold a component and positive air supplied during unloading to aid in removal therefrom. Direct supply from a sequencer having a series of individual programmably controlled dispenser heads provides for quick and flexible variation of an input sequence without manual intervention. A turret assembly has multiple chip placement heads which unload the chip carriers and facilitate orienting, centering, and squaring of the components prior to placement on a circuit board.

BRIEF DESCRIPTIONS OF THE DRAWINGS

FIG. 1 is a schematic, perspective view to illustrate the general arrangement of various portions of the apparatus of the invention relative to a circuit board positioning system.

FIG. 2 is a schematic, top plan view illustrating a positional arrangement between the transfer stations, conveyor chain, and turret assembly.

FIG. 3B is a cross sectional view generally in the direction of arrows 3B—3B of FIG. 3A.

FIGS. 4A-4E, in sequence, illustrate functions of the transfer assembly during transferring a component from a supply tape to a chip carrier of a conveyor chain.

FIG. 5 is a partial isometric view illustrating a pocket of the taped supply with a component shifted to one side of the component as provided by gravity when in position for unloading from the taped supply by the transfer assembly.

Figure 6A:
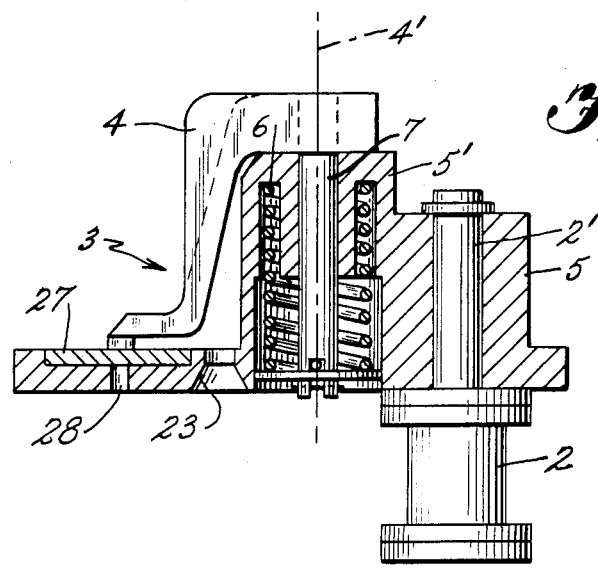
Figure 6B:
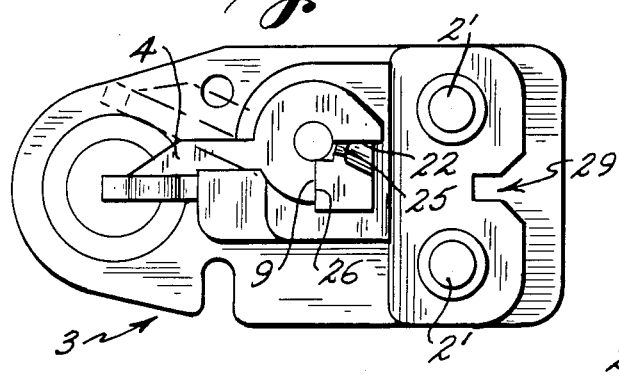

FIG. 6B is a top plan elevation of one of the chip carriers of the invention.

FIG. 6A is a front elevation, partially in section, of the device of FIG. 6B.

FIGS. 6C-6F, respectively, are front, right side, top, and bottom views of the housing of a chip carrier.

Figure 6C:
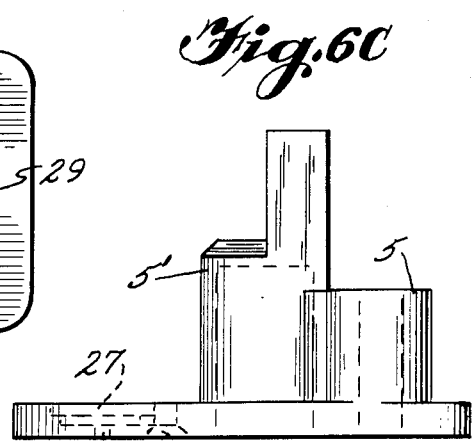
Figure 6D:
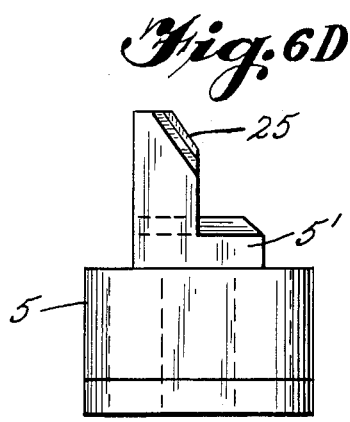
Figure 6E:
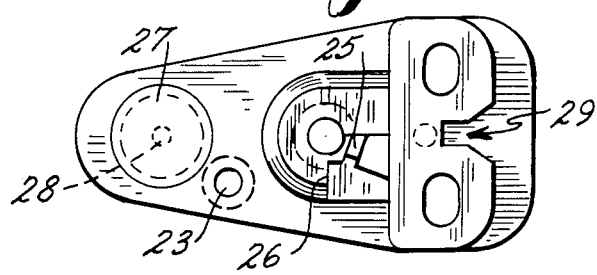

FIG. 6G is a rear view, partially in section, of the chip carrier housing of FIG. 6C.

FIGS. 6H-6J, respectively, are front, top, and right side elevations of the clamp arm of a chip carrier.

FIG. 7 is a side elevation, partially in section, of the turret assembly of the invention illustrating chip placement heads at the pickup and placement stations.

FIG. 8 is a top plan view, as viewed generally in the direction of arrows 8—8 of FIG. 7, illustrating the various stations through which the chip placement heads are moved during indexing of the rotor of the turret assembly.

FIG. 9 is a partial view generally in the direction of arrows 9—9 of FIG. 7.

Figure 10:
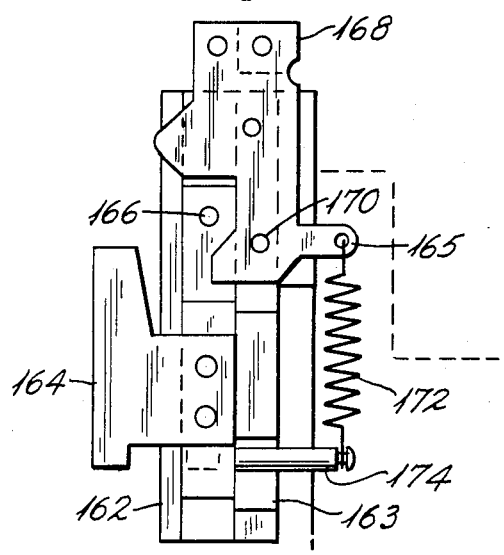

FIG. 10 is a front elevation, partially in section, of the interposer utilized at the pickup station.

Figure 11:
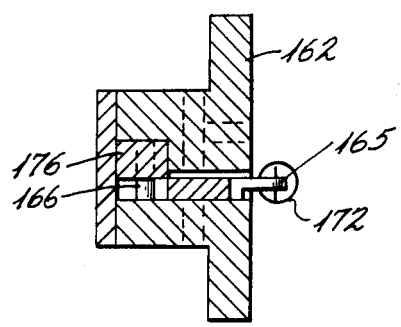
Figure 12:
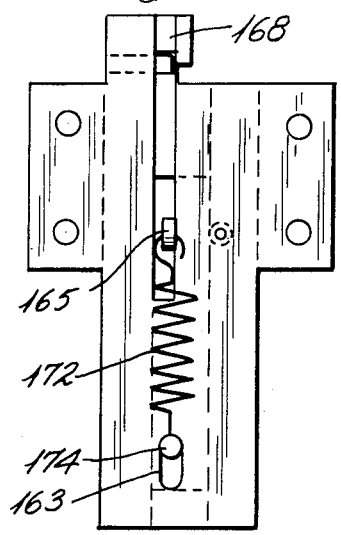

FIGS. 11 and 12 are, respectively, right side elevation and top plan views of FIG. 10.

Figure 13:
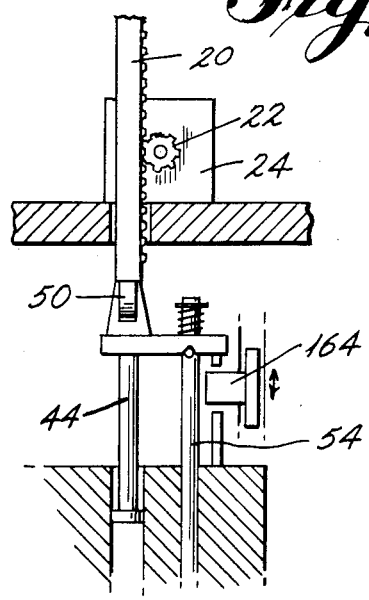

FIG. 13 is a schematic illustrating operation of the interposer of FIGS. 10–12.

Figure 14:
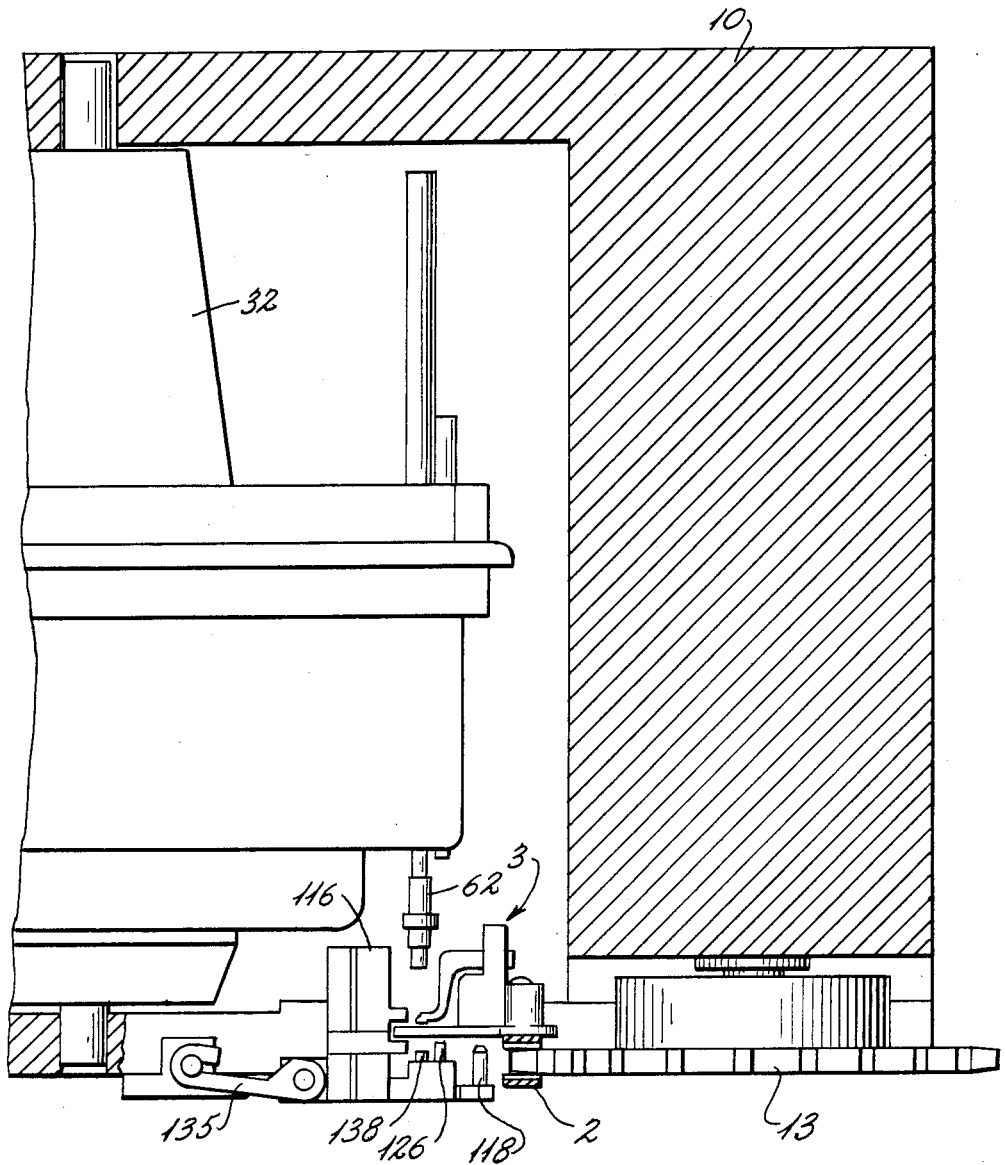

FIG. 14 is a partial side elevation at the pick up station to illustrate the front alignment assembly for the chip carrier at the placement station.

Figure 15:
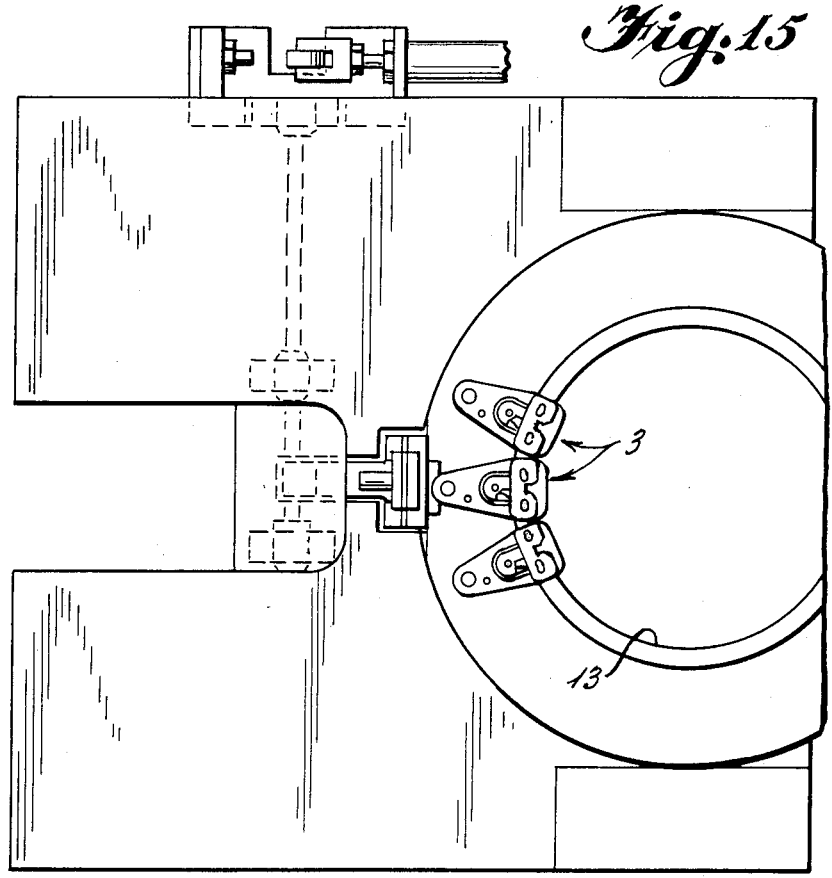

FIG. 15 is a top plan view of the front alignment assembly of FIG. 14.

FIG. 16 is a partial side elevation illustrating the rear alignment assembly.

Figure 17:
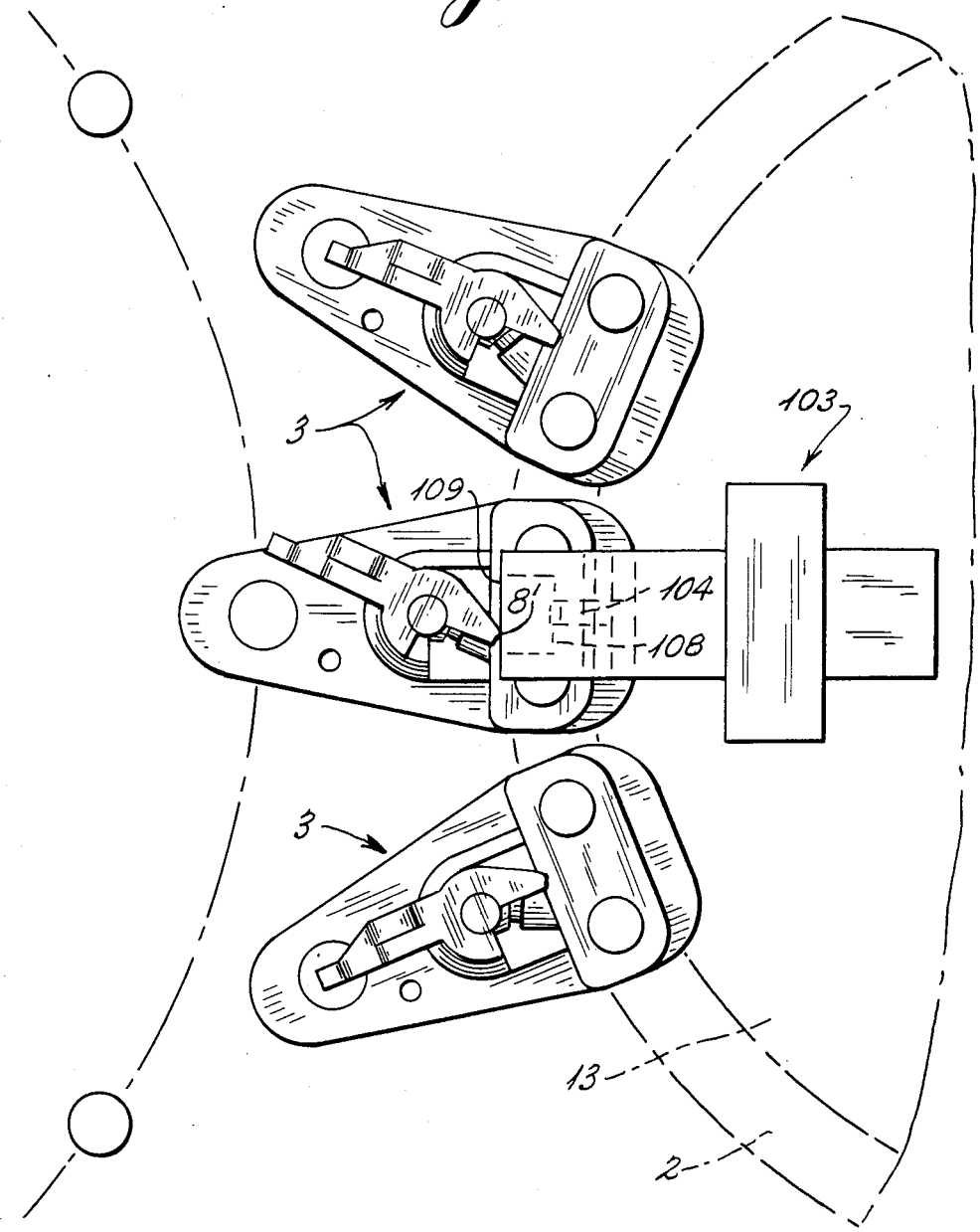

FIG. 17 is a top plan view of the device of FIG. 16.

Figure 18:
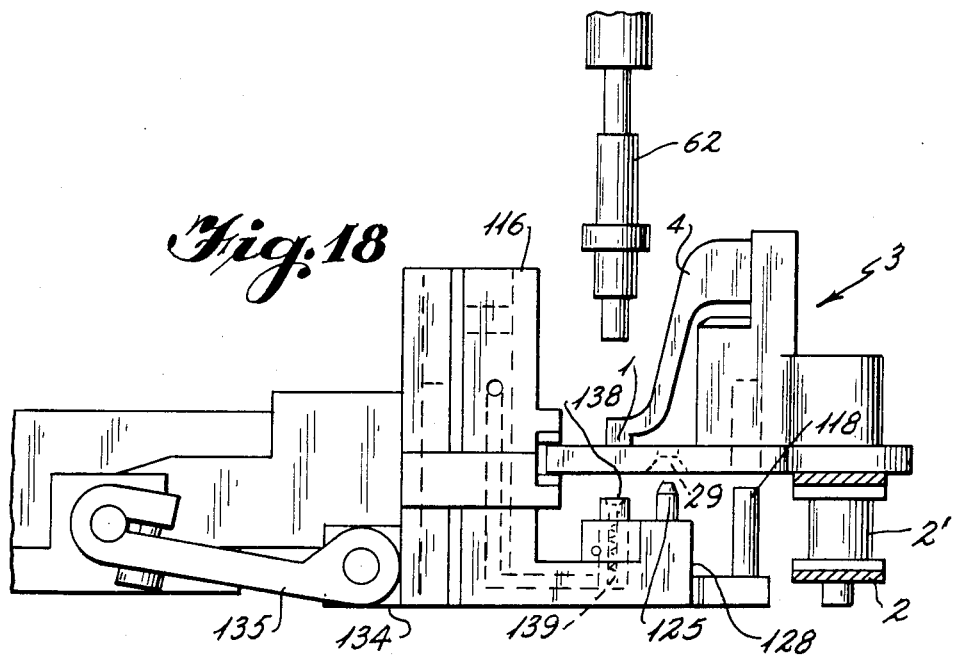

FIG. 18 is an enlargement of a portion of FIG. 14 in order to better illustrate the front alignment assembly.

Figure 19:
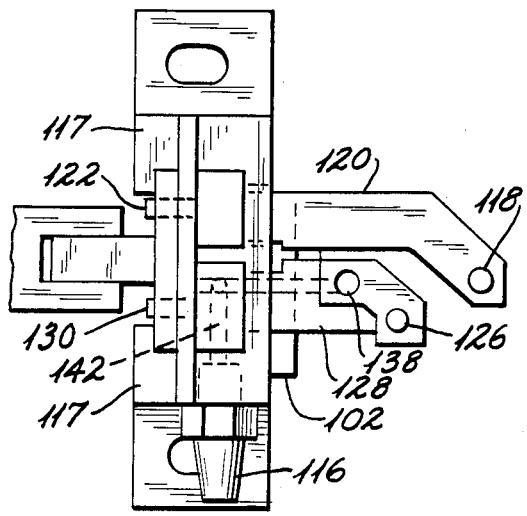

FIG. 19 is a top plan view of the device of FIG. 18.

Figure 20:
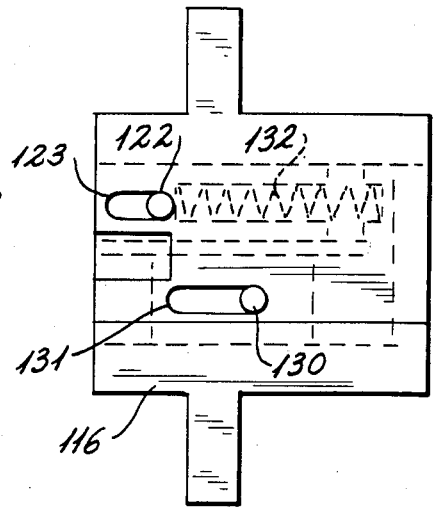

FIG. 20 is a partial left side elevation of the device of FIG. 19.

Figure 21:
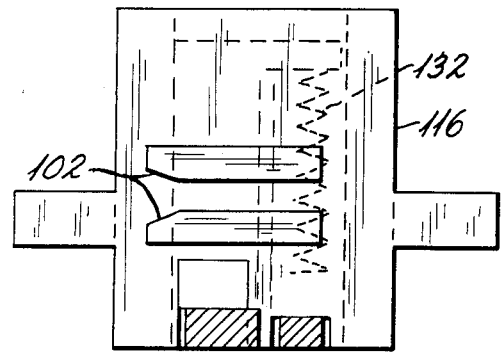

FIG. 21 is a partial right side elevation, rotated counterclockwise 90°, of the device of FIG. 19.

FIG. 22 is a side elevation of the orienting mechanism for rotating the vacuum nozzle of an orienting head to provide gross orientation of the component held thereon.

FIG. 23 is an enlarged cross-sectional view illustrating portions of FIG. 22 in greater detail.

Figure 24:
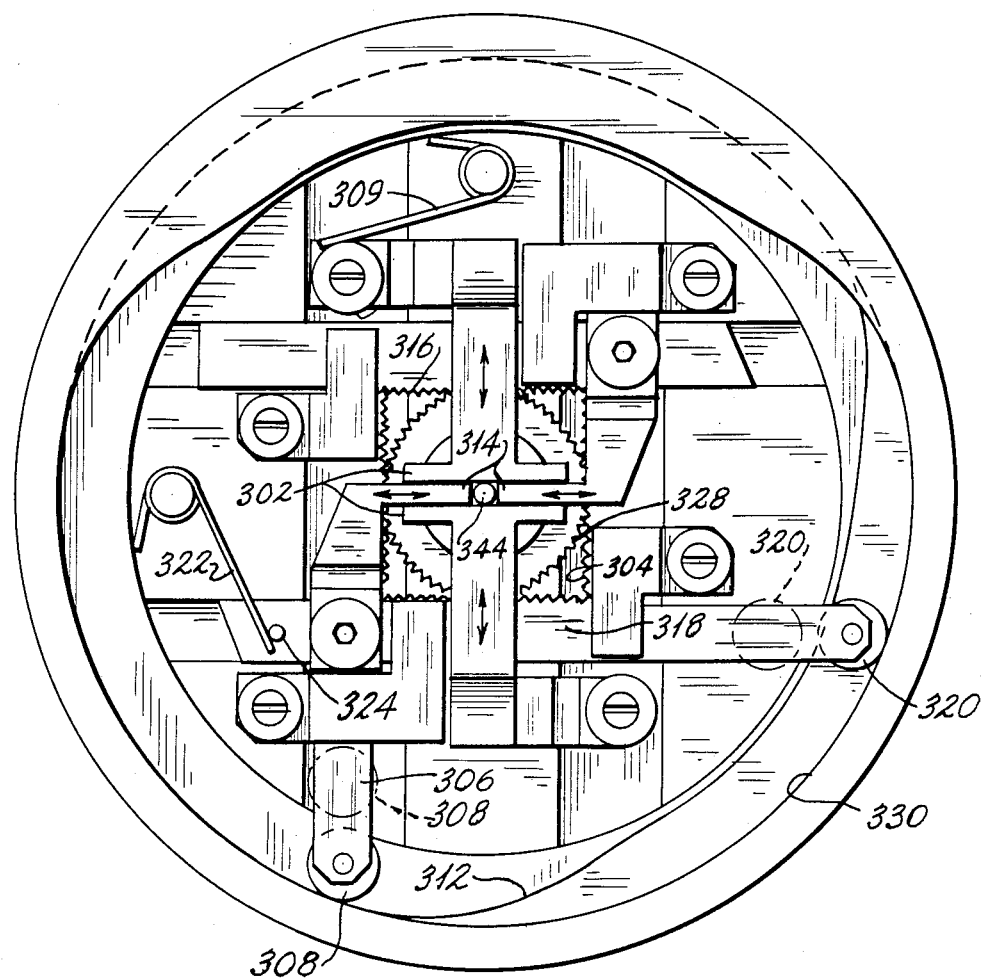

FIG. 24 is a top plan view of a centering pocket.

FIG. 25 is a front elevation, partially in section, of the device of FIG. 24.

FIG. 26 is a partial side elevation of the mechanism of the eject station.

Figure 27:
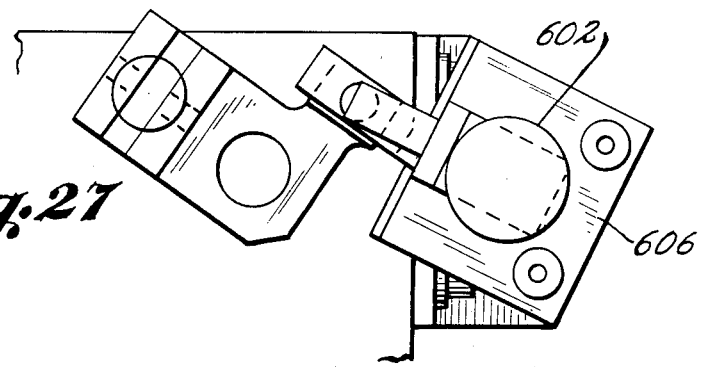

FIG. 27 is a top plan view of the device of FIG. 26.

FIG. 28 is a partial sectional view of the reset mechanism at the reset station.

FIGS. 29 and 30 are detailed, sectional views of the inner spindle illustrating two different positions for the telescopic, removable tip thereon.

FIG. 31 is a partial schematic view illustrating the mechanism at the nozzle selection station for shifting the tip between the two positions illustrated in FIGS. 29 and 30.

FIG. 32 is an enlarged elevational view of the transfer head of the transfer assembly.

FIG. 33 is a bottom plan view of the device of FIG. 32.

FIG. 34 is a right side elevation of the device of FIG. 32.

Figure 35:
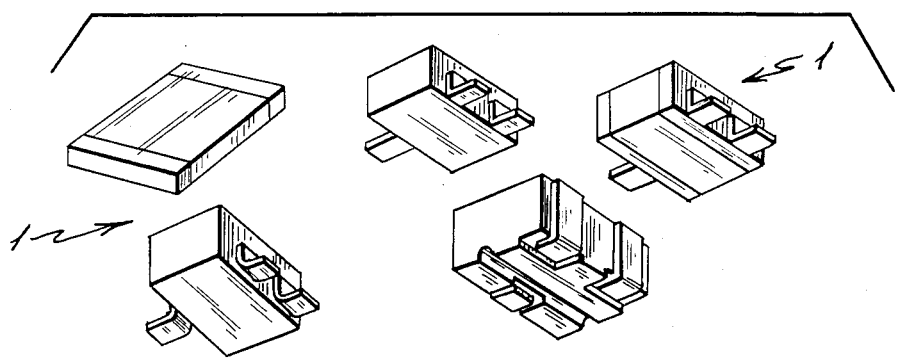

FIG. 35 illustrates various leadless and leaded surface mountable components.

DETAILED DESCRIPTION OF THE INVENTION

Like numbers are used for like elements throughout the drawings and specification.

TRANSFER ASSEMBLY

Referring to FIGS. 3A–5, a feeder index wheel 17 is incrementally rotated to advance a supply tape 11 having pockets 15 in which chips 1 are located. Wheel 17 is operatively associated with a ratchet 19, pawl 19′, and spring 20′, and the outside end of ratchet 19 is engageable by a rod 936 to effect counterclockwise rotation of ratchet 19 from the "uncocked" position to the "cocked" (phantom lined) position of FIG. 3A. During retraction of rod 936, pawl 19′ engages feed wheel 17 causing rotation thereof in a counterclockwise direction and positioning the next pocket 15 of tape 11 for removal of the component therefrom. As seen in FIGS. 4A and 4E, a transfer head is pivotal about a pivot point 909 to transfer a component from feeder wheel 17 to a chip carrier 3. Chip carrier 3 is attached to an endless chain conveyor 2 for conveying components from the various transfer/feeder stations to turret 30 for unloading of chip carrier 3, as best illustrated in the top plan view of FIG. 2.

Figure 3A:
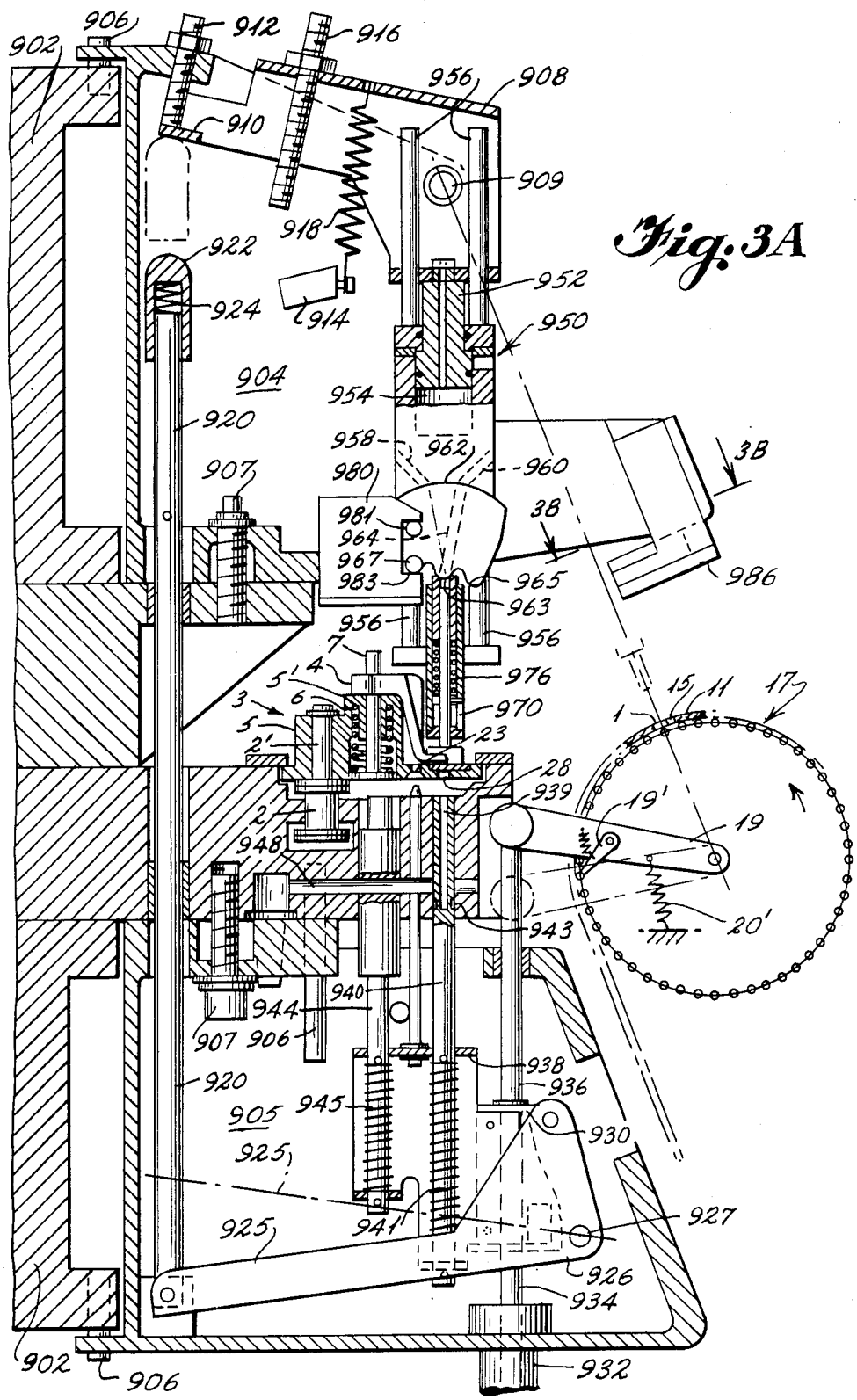
FIG. 3A is a partial, side elevation of a transfer station, with portions thereof schematically shown.

Transfer head 950 includes a support bracket 908 pivotal about pivot point 909 and a stop plate 910 engageable with an adjustable stop screw 912 to provide a clockwise limit of pivoting. Bracket 908 also has an unjustable stop screw 916 engageable with a stop plate 914 to provide an adjustable limit for counterclockwise pivoting of transfer head 950. As seen in FIG. 3A, support casting 902 supports an upper casting 904 and a lower casting 905 which are removably attached thereto by dowels 906 and machine screws 907.

An actuation cylinder 932 is attached to lower casting 905 for reciprocating piston rod 936 which, in addition to providing a "cocking" mechanism for the feeder wheel 17, supports a bracket 929 and cam 930 for reciprocation therewith. Cam 930 always is engaged by follower roller 928 of bell crank 926 which, in turn, is pivotal about pivot point 927 with long arm 925 thereof supporting a lifter rod 920. Upon extension of rod 936, cam surface 930 is raised such that arm 925 of bell crank 926 is rotated clockwise to raise rod 920. As seen in FIGS. 4A and 4B, a tip 922 of rod 920 is always in engagement with plate 910 of bracket 908 so that, upon lifting rod 920, transfer head 950 is caused to rotate in a clockwise direction against the bias of tension spring 918. Tension spring 918 is of sufficient stiffness to retain contact between plate 910 and tip 922 so that follower roller 928 remains in engagement with cam surface 930 upon retraction of rod 936 by cylinder 932.

Bracket 929 has a locator rod 942 attached thereto which is engageable in a locator hole 23 of chip carrier 3 upon raising bracket 929, such that accurate positioning of chip carrier 3 is provided for purposes of loading a chip 1 thereon. Raising of bracket 929 also raises a clamp release rod 944 for opening a clamp arm 4 of chip carrier 3, as will be described in greater detail with reference to FIGS. 6A–6J. Bracket 929 also supports a vacuum tube 940 having duct 939 and circumferential groove 943 so that, upon raising of bracket 929, groove 943 communicates with a vacuum source 948. Such an arrangement allows vacuum to be applied to orifice 28 and porous plug 27 of chip carrier 3 to hold a chip 1 thereon prior to closing clamp arm 4. Springs 941 and 945 are sufficient for the functions of rods 944 and 940 to be accomplished without damage to chip carrier 3.

Transfer head 950 includes a piston 952 fixed to pivotal bracket 908 and a cylinder and housing 954 extensible and retractable along support rods 956 in accordance with actuation of cylinder 954. Cylinder housing 954 suitably supports a rocker valve 964 in any well known manner such that an upper end of valve orifice 966 may be caused to communicate with an air duct 960 in housing 954, a vacuum duct 958 in housing 954, or a neutral position between ducts 958 and 960 so that positive or negative air pressures, or neither, may be applied to orifice 966. Housing 954 has a tubular extension 968 on the lower end thereof, within which a tube 972 is retractable against the bias of spring 976 acting against a pin 974. Pin 974 is reciprocatable in a slot 970 so as to also prevent rotation of tube 972 in tubular extension 968. The upper end of hollow tube 972 is telescopic within a brass sleeve bearing 969 which in turn, telescopes into tubular extension 968 and provides a spherical bearing surface for central knuckle 963 of rocker valve 964 ensuring that orifice 966 is always in communication with tube 972.

Upper casting 904 also is provided with rocker valve actuators 980 and 986, as will be explained later. Actuators 980 and 986 also are provided with locator grooves 988 so that a corresponding one of the rods 956 is engageable with a locator slot 988 at the extreme clockwise and counterclockwise positions of transfer head 950 to provide acurate alignment of hollow tube 972 at the feeder unloading and chip carrier loading stations.

Referring to FIG. 4A, rod 936 is in the retracted position such that transfer head 950 is at the feeder unloading station. As seen from this figure, transfer head housing 954 is extended so that rocker valve 964 is positioned to apply vacuum to tube 972 for pickup of a component 1 from the pocket 15 of feeder tape 11. Rocker valve 964 was positioned to supply a vacuum during lowering of transfer head 954 toward the feeder wheel 17 by knuckle 965 of rocker valve 954 engaging surface 987 (FIG. 3B) of actuator 986 to shift the rocker valve from the neutral position to the position of FIG. 4A. The mechanism provides that vacuum is applied to tube 972 when extended sufficiently to engage component 1.

Figure 4C:
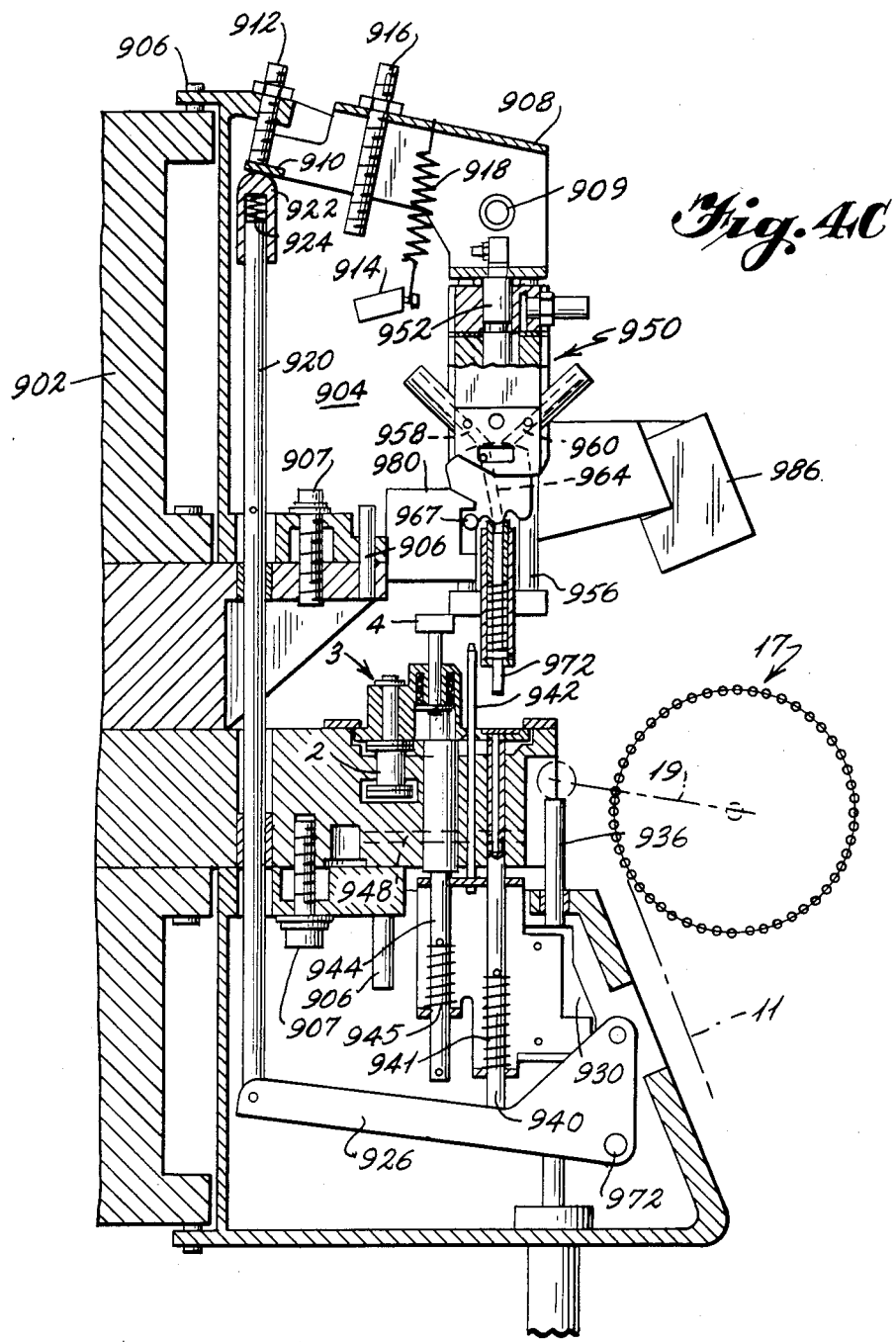

Thereafter, cylinder 954 is retracted to the position of FIG. 4B, and then cylinder 932 is actuated to pivot head 950 clockwise to the position of FIG. 4C. Next, cylinder 954 is extended and knob 967 of rocker valve 954 engages surface 983 of actuator 980 so that tube 972 is in communication with a low pressure air ("air kiss") from air fitting 960 upon the component 1 engaging porous plug 27 of chip carrier 3. The "air kiss" ensures positive transfer of the component from the tip of tube 972 to the chip carrier 3.

Figure 4E:
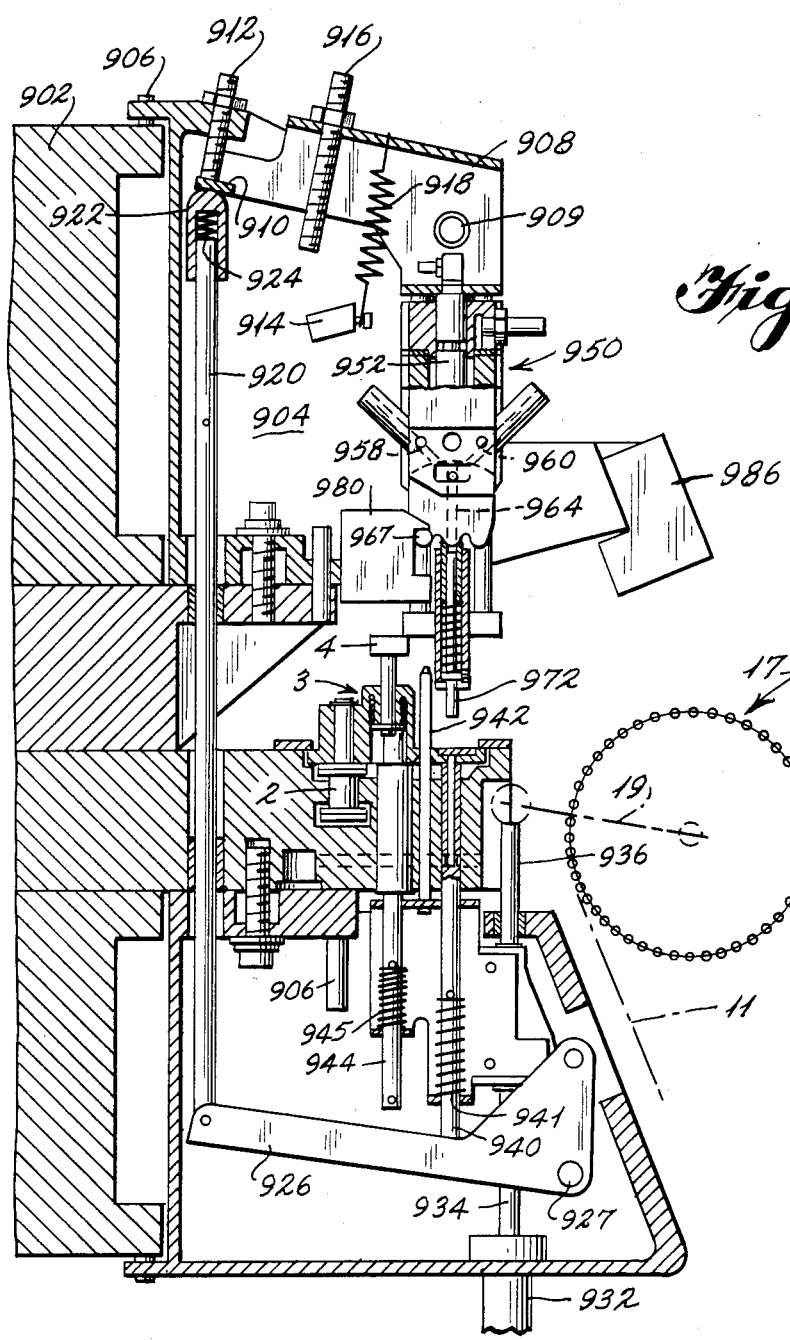

Having placed component 1 on the chip carrier 3, transfer cylinder 954 is retracted and knob 967 of rocker valve 964 engages upper surface 981 of actuator 980 to position the rocker valve 964 in the neutral position such that neither positive nor negative air pressure is applied to tube 972, as illustrated in FIG. 4E. During such retraction of cylinder 954, a clamp arm 4 of chip carrier 3 engages the top surface of the chip to hold it in place for subsequent transfer to a turret assembly 30. With cylinder 954 retracted, rod 936 is retracted by cylinder 933 such that head 950 is pivoted counterclockwise by spring 918 to the supply station. With a transfer head 950 at each feeder station 17 of FIG. 2, each chip carrier 3 may be loaded with a component from any one of a plurality of feeder and transfer stations.

As may be appreciated by reference to FIGS. 4A-4E, retraction of rod 936 allows a counterclockwise rotation of ratchet 19 to index the feeder wheel 17 and position the next pocket 15 of tape 11 for pickup of a component by tube 972.

Referring to FIGS. 6A-6J, each chip carrier 3 comprises a housing 5 mountable upon pins $2^1$ of chain 2. Housing 5 has a barrel $5^1$ into which a rod 7 of clamp arm 4 fits for rotation about, and reciprocation along, an axis $4^1$ (FIG. 6A). A compression spring 6 fits within barrel $5^1$ and urges rod 7 downwardly, as viewed in FIG. 6A, by engaging a washer attached to rod 7. Housing 5 also includes a depression within which is located a porous pad 27, such as a sintered metal pad, and an orifice 28 provides communication of pad 27 with the bottom of housing 5. A tower portion 21 extends upwardly of barrel $5^1$ and provides a stop surface 26 and a guide surface 25. Housing 5 also includes a locator slot 29 for purposes of gross location of the chip carrier at the pickup station of turret assembly 30, as will be explained with reference to FIGS. 16 and 17. Housing 5 also includes a locator hole 23 for reception of the previously described locator rod 942 to properly locate chip carrier 3 during loading of a component from the transfer head and for reception of locator rod 126 to provide "fine" positioning of chip carrier 3 during unloading of a chip at the pickup station of turret assembly 30. Clamp arm 4 has a stop surface 9 (FIG. 6I) engageable with stop surface 26 (FIG. 6E) of housing 5 in the component clamping position of FIGS. 6A and 6B. When rod 944 (of FIGS. 4A-4E) is raised into engagement with rod 7 of chip carrier 3, clamp arm 4 is raised against the biasing of spring 6. Further, spring 6 is pinned to rod 7 so as to oppose clockwise rotation, as viewed in FIG. 6B, of arm 4. Clamp arm 4 also has a follower portion 8 (FIGS. 6H-6J) which rides up guide surface 25 under the influence of spring 6 during the raising and rotation of clamp arm 4. By such a structural arrangement, a component may be clamped onto porous pad 27 by clamp arm 4 engaging the top of the component, while clamp arm 4 also is pivotal away from porous pad 27 during raising to prevent interference with any head for loading a component onto or removing a component from pad 27.

Referring to FIGS. 2 and 7-9, turret assembly 30 comprises a stationary hub 32 fixed to a support casting 10 and provided with: fitting 86 for low air pressure (approximately 3 psi), fitting 87 for high air pressure (approximately 25 psi), and fitting 88 for vacuum (approximately 23 inches of mercury). These fittings cooperate, respectively, with grooves 38, 40, and 36 on the outer periphery of hub 32, as seen in FIG. 7. Bearings 35 are provided for rotation of rotor 34 about hub 32, with sprocket 74 attached to rotor 34 and drivable by drive sprocket 78 via timing belt 76.

Rotor 34 comprises ten different vacuum heads equally spaced in an annular arrangement for indexed movement between the various stations noted in FIG. 8. Each chip carrier 3 is sequentially presented to the pickup station of FIG. 8 for removal of the component from chip carrier 3 by one of the vacuum heads. In order to facilitate this, a front alignment assembly 116 FIGS. 19-21 and a rear alignment assembly 103, (FIGS. 16 and 17) are located at the pickup station. Z-axis locator guides 102 engage the top and bottom of that portion of chip carrier 3 which is furthest from chain 2 to properly position the chip carrier in 3 the vertical direction as it is moved into the pickup station (Z-axis locator guides 102 are best seen in FIGS. 18 and 21). On the opposite side of chain 2 from front alignment assembly 116, a gross locator pin 104 of rear alignment assembly 103 is fired by actuation of cylinder 106 to engage the pin with guide slot 29 of chip carrier 3 and thus provide gross alignment of chip carrier 3.

Referring to FIGS. 14, 15 and 18-21, front alignment assembly 116 is provided with guides 117 within which an actuator plate 134 is slidable upon actuation of a link 135. A clamp opener rod 118 is mounted on an L-shaped block 120 having a guide pin 22 slidably received within slot 123 of actuator plate 134. A fine locator pin 126 is affixed to another L-shaped block 128 having a guide pin 130 slidably received within a slot 131 of actuator plate 134. Still further, a spring 132 is interposed between blocks 120 and 128, as seen in FIGS. 20 and 21, to allow relative motion therebetween according to the limits of slots 123 and 131. Housing 116 also has an air fitting, as seen in FIG. 19, and corresponding ducting in communication with a nozzle 138 of block 128 so as to provide low air pressure or vacuum thereto upon alignment of holes 142 and 144 (FIG. 18) during raising of block 128. The selection of vacuum or low air pressure on nozzle 138 is performed in a manner to be described with reference to FIGS. 10–13.

Thus, by actuation of link 135 to raise plate 134, pin 126 is engaged within hole 29 of chip carrier 3 to provide "fine" location of the chip carrier, and nozzle 138 is placed in communication with porous pad 27 via orifice 28 of chip carrier 3. As seen in FIG. 18, nozzle 38 is spring biased upwardly by a compression spring 139 in order to provide for good engagement while preventing damage to mechanical parts during such engagement. Upon raising block 120, pin 118 engages the bottom of rod 7 so as to open clamp arm 4 of the chip carrier 3. During the subsequent unclamping of a chip 1 by lifting and rotating the clamp arm 4, vacuum is applied to the porous pad 27 so as to retain the unclamped component prior to engagement thereof by pickup tip 66. Upon engagement of the chip by vacuum tip 66, a low positive air pressure is applied to porous pad 27 via nozzle 138 so as to ensure positive disengagement of the component from porous pad 27.

Once vacuum tip 66 has raised the component off of porous pad 27, a hold-open piston 108 of assembly 103 (FIGS. 16 and 17) is fired by cylinder 110 to position a front surface 109 thereof so that portion $8^1$ of clamp arm 4 slides therealong to keep clamp arm 4 in the open position after clamp opener rod 118 has been withdrawn from chip carrier 3. Thus, clamp arm 4 cannot swing into interference with pickup tip 66 as chip carrier 3 moves away from the pickup station. A threaded stop rod 112 is provided to limit extension of piston 108.

Referring to FIGS. 7–9, the pickup station (on the right side of FIG. 7) and the placement station (on the left side of FIG. 7) will be interchangeably referred to so that all of the component parts of one head assembly of the rotor 34 may be adequately described. As viewed in FIG. 7, one of the ten head assemblies of rotor 34 is positioned at the placement station and has a piston 41 receivable within a cylinder 46 of rotor 34 with piston rod 44 extending through bearing sleeve 45 and supporting an L-shaped top portion 48. Cylinder 46 and piston 41 comprise an air spring, the bottom end of which is closed off by plug 47 and which communicates via orifice 43 near the bottom thereof, with annular groove 40 of hub 32 to provide high pressure air from fitting 87. L-shaped portion 48 has a follower roller 50 which, as seen in FIG. 9, follows a camming lobe 12 at the placement station to depress rod 44. Further depression of pin 44, at the placement station is provided by toothed rod 14 extending through cam lobe 12 into engagement with follower 50 and reciprocatable via pinion gear 16 and stepper motor 18. The bottom of L-shaped portion 48 is provided with four inverted-V grooves 52 spaced 90° apart to receive a pin 60 of outer spindle 54, with spring 56 biasing spindle 54 upwardly to engage pin 60 with groove 52. Outer spindle 54 is telescopic within sleeve bearing 55 of rotor 34 and has an outer diameter sufficiently smaller than the inner diameter of the corresponding bore of rotor 34 so as to provide air passage therebetween. An inner spindle 62 communicates with and telescopes into the lower end of outer spindle 54 and is biased to the position of FIG. 7 by a spring 64.

Referring to FIGS. 7 and 8, a gap (provided by the loose fit between outer spindle 54 and the corresponding bore of rotor 34) is placed in communication with low positive air pressure or vacuum, via respective duct work 72 and 70 in rotor 34, according to the position of a valving rod 68. When the head is at the pickup station, interposer 164 is positioned between rod 40 of L-shaped portion 48 and valving rod 68 to switch spindle 62 from vacuum to low pressure positive air. As seen on the right side of the hub 32 in FIG. 7, valving rod 68 is provided with grooves 75 and 73 for communicating, respectively, with the vacuum and low pressure air ducts 70 and 72 according to vertical positioning of valving rod 68. Rod 68 also has grooves 69 engageable by a spring biased detent 71 to hold valving rod 68 in the selected position. Moving valving rod 68 down by one notch 69 will put vacuum duct 70 in communication with groove 75 and thus in communication with the vacuum spindle 62, while moving valving rod down another notch 69 will interrupt communication of the vacuum and provide communication of a low pressure duct 72 with groove 73 and thus with hollow nozzle 62. Thus, a vacuum may be applied to nozzle 62 in order to hold the component theron and, subsequently, a low pressure air may be applied to positively remove the component from the tip of nozzle 62 during placement of the chip at the placement station.

Stepper motor 24, pinion gear 22, and rack 20 provide reciprocation of rods 44 and 54 in a manner similar to the same type elements as described with reference to the placement station. However, the pickup station has no camming lobe such as lobe 12 of the placement station since it is desired that nozzle 62 not be displaced as far downwardly at the pickup station as at the placement station. Therefore, in order to be able to actuate valving rod 68 at the pickup station, it is necessary to provide the interposer 164 illustrated in FIGS. 10–13.

Referring further to FIG. 7, it may be seen that an optical part detector comprising a transmitter 80, receiver 82 and a light beam 84, works in concert with spindle 62 to indicate whether or not a component is missing from the tip 66 or is tilted on edge while being held by the vacuum of tip 66. Accordingly, the distance that spindle 64 travels with a component prior to the breaking of light beam 84 is programmable according to the thickness of the component being handled. And the distance by which spindle 54 is depressed, according to the components being handled and the thickness of the board on which they are placed, is controllable by the stepper motor 18 according to a microprocessor or other form of a controller. Further, different components require different placement pressures during surface mounting of components onto the circuit board. Control for the mounting pressures are provided in the instant invention by spring 64 and the amount of displacement of spindle 54 according to stepper motor 18, thus providing continuous programmable adjustment up or down for displacement of spindle 54.

Referring to the right side of FIG. 7, one of the heads of rotor 34 is positioned at a pickup station at which spindle 54 does not need to be depressed as far as when at the placement station. Accordingly, some means needs to be temporarily placed between the upper end of valving rod 68 and actuator set screw 49 in order to actuate valving rod 68 during pickup. Interposer 164 (seen in detail in FIGS. 10–13) is located at the pickup station and supported by support casting 10 in any well known manner so as to provide that pin 49 of L-shaped portion 48 can actuate valving rod 68 through displacement of interposer 164. For instance, to pick up a component from a chip carrier 3 at the pickup station, stepper motor 24 is actuated sufficiently to drive spindle 54 downwardly such that pin 49 engages actuator 164 which, in turn, engages the upper end of valving rod 68 and displaces it sufficiently to align groove 75 of valving rod 68 with ducting 70 thus applying vacuum to spindle 62. Upon actuation of interposer 164, pin 166 thereof, in moving downwardly, engages with pivotal valve actuator 168 to cause pivoting thereof in a counterclockwise direction against the biasing of spring 172. Pivotal valve actuator 168 has a fitting mounted thereon so as to communicate with either a low air fitting or a vacuum fitting, both of which are attached to a housing 162 of the interposer assembly. In this manner, low air and vacuum are selective for application to nozzle 138 of alignment assembly 116 (of FIGS. 19-21).

In operation, a vacuum is on nozzle 138 to hold the component on the chip carrier 3 during opening of the clamp arm 4 and lowering of tip 66 into engagement with the top of the chip. As described earlier, spindle 54 has a vacuum applied thereto, upon displacing of valving rod 68 downwardly, by communication of ducting 78 and groove 75. The mechanical interaction between these parts is such that nozzle 66 engages the component while slightly compressing spring 64 as needed for the pickup pressure of the particular component, with further compression against spring 64 allowing interposer 164 to actuate valving rod 68 and apply vacuum to top 66. Pivotal valving member 168 is also shifted at this time to change nozzel 138 from vacuum to "air kiss," thus providing positive displacement of the component from chip carrier 3. Pivotal member 168 has an air fitting attached thereto which is communicable with one of two air fittings attached to the housing of the interposer assembly to provide for the switching between vacuum and low air pressure, as earlier described. Further, upon retraction of spindle 54 with a component at the placement station, L-shaped portion 48 engages pivotal member 168 to switch the supply to nozzle 138 of the front alignment assembly from low air pressure to vacuum in readiness for the next chip carrier 3.

As seen in FIG. 8, the component is carried from the pickup station to the orient station by the chip placement head of the rotor. At the orient station, air cylinders 224 (FIG. 22) are located on the top of support casting 10 and connectable to a rod 216 which is telescopic within sprocket 218 and rotatable therewith by stepping motor 226 via drive sprocket 228 and timing belt 220. The amount of rotation is detactable by encoder 230 and photosensor 232. As seen in FIG. 23, a spindle engager 210 is telescopic within shaft 216 against the bias of spring 210 as defined by the limits of slot 217 and pin 214. The bottom of spindle engager 210 is provided with four notches 212 spaced 90 degrees apart in order to engage pin 58 of outer spindle 54 therein. A button 222 is provided on top casting 10 and is engageable within a slot 234 of L-shaped portion 48 at the gross orient station to prevent downward displacement of L-shaped portion 48 during engagement of member 210 and outer spindle 54, as will be described.

Upon actuation of air cylinder 224, shaft 216 is extended downwardly to effect engagement of pin 58 in notch 212. Further extension of shaft 216 displaces spindle 54 downwardly to disengage pin 60 from the inverted-V notch 52. With pin 60 disengaged from groove 52, the spindle 54 may be rotated by spindle engager 210 which, in turn, is rotated in 90 degree increments by stepper motor 226. Having selected the desired rotation (gross orientation), shaft 216 is retracted by air cylinder 224 so that pin 60 to engages in one of the grooves 52 to hold that orientation during transport of the component to a subsequent station.

As seen in FIG. 8, the next two stations through which a chip placement head of rotor 34 is moved are centering stations I and II one of which is used in for centering the component. Selection of station I or II is based on the component body falling into one of two different ranges of body sizes and/or configurations. At each of the centering stations, the centering mechanism is oriented or rotated about an axis therof to agree with the gross orientation provided earlier to the component body by the orientation mechanism of FIGS. 22 and 23. Centering stations I and II have the same mechanical operation and, except for possible changes in configuration of the centering fingers themselves, are substantially the same in structure. Accordingly, FIGS. 24 and 25 may be used to describe both centering mechanisms and, referring to these figures, a pair of outside centering fingers 302 and inside fingers 314 are closeable in concert toward a spring loaded pin 344 coaxial with the central axis of centering mechanism 300. Outside fingers 302 are displaced by equal amounts in opposite directions by racks 304 and 306 cooperating with spur gear 310, with follower 308 following a lower cam surface 312 under the bias of spring 309. Likewise, inner fingers 314 are attached to racks 316 and 318 which are engaged with upper spur gear 328 in order to ensure that they displace in opposite directions by equal amounts. Again, a follower 320 is attached to one of the racks and is urged into engagement with an upper cam surface 330 by a spring 322. By such an arrangement, relative rotation between the camming surfaces 312 and 330 and the corresponding fingers will cause closing of the fingers against the spring biasing, with the cam configurations and displacements determining the closing of the fingers upon a component.

It is desirous that the outer centering fingers 302 engage the long edges of a generally rectangular component. Thus, provision is made for rotating pocket 300, with centering fingers open, in order that the centering fingers agree with the orientation already imparted to the component at the previous station. To provide such orientation to the centering pocket, it is necessary to rotate the camming surfaces 330 and 312 and centering fingers together so that there is no closing of the fingers. To accomplish such simultaneous rotation, pulley 334 (which rotates the camming surfaces 330 and 312) and pulley 340 (which rotates the centering fingers) are rotated together with the same rotational velocity about the central axis of the pocket.

Having received the component between the open fingers, only pulley 334 is rotated to move cam surfaces 312 and 330 and close the fingers to square and center the component. At this time, further "fine" orientation may be imparted to the component by rotating the centering pocket as a whole, with pulleys 340 and 334 rotated together, such that the centering fingers are still closed upon the component. The component is thus rotatable by any amount in the range of 0.9-360 degrees. During orientation and centering of a component by the centering pocket 300, the component is always held by vacuum applied to tip 66 of the chip placement head, so as to rotate the component relative to the tip 66 while it is held thereon. The centering fingers are easily replaceable, without the need for realigning the whole mechanism. Further, the spring biasing of the fingers to the closed position under the control of a cam surface allows the part configuration to control the amount or degree of closing of the fingers, and the cam drive provides for less impact and shock on the components during closing of the fingers.

After the centering station, the component is transported to the placement station, the operation of which has already been described.

EJECT STATION

As described with reference to the placement station and FIG. 7, an optical sensor at the placement station will abort a placement by halting complete downward displacement of spindle 54 upon sensing that a component held by the vacuum tip 66 is tilted on its edge. A vacuum tip 66 holding such a tilted component is moved to the next index position of rotor 34, namely, the eject station.

As seen in FIGS. 26 and 27, an eject cylinder 602 and housing 606 are a fixed to top casting 10 by means of a bracket 601. Eject plate 604 is vertically reciprocatable within housing 606 according to actuation of eject cylinder 602. Thus, a projecting portion 605 may engage the top end of valving rod 68 to displace it downwardly sufficiently to align grooves 73 and ducting 72 (as seen on the right side of FIG. 7) so that low pressure positive air is supplied to tip 66 and the component is ejected therefrom.

RESET STATION

As seen in FIG. 8, the next position to which rotor head is rotated is the reset station, at which valving rod 68 is reset to the original position illustrated in the right hand side of FIG. 7 so that neither a vacuum or positive air pressure is applied to vacuum tip 66. Thus, valve actuating rod 68 is in proper position for picking up a component at the pickup station.

NOZZLE SELECTION STATION

As seen in FIG. 8, a nozzle selection station follows the reset station.

As seen in FIGS. 29 and 30, removable tip 66 is mounted on inner spindle 62 in a telescoping arrangement with detent balls 802 of tip 66 engageable selectively with upper and lower annular notches 812 and 814 in the outer surface of spindle 62. An O-ring 804 retains balls 802 while providing yieldable pressure to hold the balls in detent notch 812 or 814 as the case may be. Thus, when tip 66 is in the raised position of FIG. 29, only tip bore 811 is in communication with central bore 801.

However, in order to apply vacuum to a greater surface area of a component, tip 66 may be lowered to the position of FIG. 30. Thus, vacuum tip area is increased by an amount indicated at portion 803 in FIG. 30. Tip 66 has an internal annular groove 806 which provides communication from bore 801 and holes 816 to slots 818 in the outer surface of spindle 62, thus providing a vacuum path to portion 803.

FIG. 31 illustrates a device which may be used to shift tip 66 up and down on spindle 62, automatedly, at the nozzle selection station. Arm 828 is pivotally attached to rod 821 and 825 so that either of cylinders 820 and 824 may be actuated while the other is held stationary, so as to angularly displace arm 828 and engage either surface 808 or 810, as indicated in phantom lines.

REPAIR FUNCTION

If a component isn't placed on the chip carrier by the transfer assembly, then according to the modification illustrated in FIGS. 32 and 33 the transfer head is returned to feed wheel 17 (which has been indexed to present the next component) and loading of the same or a subsequent chip carrier 3 may be attempted.

On the other hand, if an incorrect chip placement is detected by optical detector 80, 82 at the placement station, repair may be performed by any of several methods.

In one method a particular number of chip carriers 3 are left empty, in or after a second sequence of components, according to the probability of required repairs per a first sequence of components. Then, after the first sequence of components has been placed onto a circuit board, the chain conveyor is non-intermittently moved, rather then incrementally indexed, in a forward or reverse direction to supply "repair" components to the pickup station. As needed, the empty chip carriers also may be run continuously between various transfer assemblies corresponding to such repair.

In another method, empty chip carriers are not automatically allotted. Rather, at the end of a placement sequence, an exact number, if any, of repair components needed are fetched by continuously running the conveyor to position the next unloaded carrier(s) 3 to and from the required transfer station(s) 17 for delivery to the placement station, without regard to probability of repairs needed.

It will thus be seen that the objects set forth above, among those made apparent from the preceeding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

We claim:

1. A method of handling surface mountable electrical components and supplying said components to a pickup station in a preferred sequence, said components being generally parallelopiped in shape with a top, bottom, and sides, said method comprising the steps of:
   providing a plurality of component carriers attached to an endless conveyor, each of said carriers comprising a housing having a porous pad for receiving a component, and a clamp arm engageable with said component top surface to clamp said component on an upper surface of said porous pad and in order to provide that leadless and leaded types of said surface mountable components are equally clampable by said carrier;
   indexing said conveyor along a path of travel and presenting said carriers to feeder stations arranged along said path of travel;
   transferring said components individually from selected feeders of said feeder stations to selected ones of said carriers, according to a controller, in order to provide said preferred sequence; and conveying said sequence of components to said pickup station.

2. A method as in claim 1, and further comprising the steps of:

opening the clamp arm of a selected carrier during transferring of a component thereto from a corresponding selected feeder;

applying vacuum to said component bottom via said porous pad in order to maintain said component on said pad prior to closing of said clamp arm; and closing said clamp arm onto said component top and clamping said component to said pad for securement of said component during said conveying.

3. A method as in claim 2, and further comprising the step of:

indexing said selected feeder during said transferring in order to position a next component for a subsequent transferring step according to said controller.

4. A method as in claim 1, and further comprising the steps of:

providing a turret assembly with a rotor having multiple chip placement heads indexable along a generally circular path of travel between said pickup station and a placement station;

applying a vacuum to said porous pad of each carrier at said pickup station in order to retain a component thereon during opening of said clamp arm;

opening said clamp arm of each carrier at said pickup station and engaging a component thereat with a pickup portion of a corresponding one of said chip placement heads;

applying a positive pressure to said porous pad according to said engaging to positively assist in removal of a component therefrom by said pickup portion;

removing said component from said carrier pad at said pickup station to provide a captured component;

transporting said captured component to said placement station; and placing said captured component at a selected position on a circuit board.

5. A method as in claim 4, and further comprising the step of:

holding said clamp arm open during movement of a carrier away from said pickup station in order to prevent any interference between said clamp arm and said pickup portion of said chip placement head.

6. A method as in claim 4, and further comprising the steps of:

detecting replacement component requirements;

moving said conveyor nonintermittently to position at least one of said carriers at a corresponding feeder station according to said requirements;

transferring a replacement component from said corresponding feeder station to said one carrier;

moving said conveyor nonintermittently to position said replacement component at said pickup station;

picking up and transporting said replacement component from said pickup station to said placement station; and placing said replacement component at a corresponding position on said circuit board.

7. An apparatus for handling surface mountable electrical components and supplying said components to a pickup station in a preferred sequence, said components being generally parallelopiped in shape with a top, bottom, and sides, and comprising:

a plurality of component carriers attached to an endless conveyor, each of said carriers comprising a housing having a porous pad for receiving a component and a clamp arm engageable with said component top surface to clamp said component on an upper surface of said porous pad and in order to provide that leadless and leaded types of said surface mountable components are equally clampable by said carrier, for conveying said preferred sequence of components to said pickup station;

means for indexing said conveyor along a path of travel and presenting said carriers to feeder stations arranged along said path of travel; and means for transferring said components individually from selected feeders of said feeder stations to selected ones of said carriers, according to a controller, in order to provide said preferred sequence;

8. An apparatus as in claim 7, and further comprising:

means for opening the clamp arm of a selected carrier during transferring of a component thereto from a corresponding selected feeder;

means for applying vacuum to said component bottom via said porous pad in order to maintain said component on said pad prior to closing of said clamp arm; and means for closing said clamp arm onto said component top and clamping said component to said pad for securement of said component during said conveying.

9. An apparatus as in claim 8, and further comprising:

means for indexing said selected feeder during said transferring in order to position a next component for subsequent transferring according to said controller.

10. An apparatus as in claim 7, and further comprising:

a turret assembly with a rotor having multiple chip placement heads indexable along a generally circular path of travel between said pickup station and a placement station;

means for applying a vacuum to said porous pad of each carrier at said pickup station in order to retain a component thereon during opening of said clamp arm;

means for opening said clamp arm of each carrier at said pickup station and engaging a component thereat with a pickup portion of a corresponding one of said chip placement heads;

means for applying a positive pressure to said porous pad according to said engaging to positively assist in removal of a component therefrom by said pickup portion;

means for removing said component from said carrier pad at said pickup station to provide a captured component;

means for transporting said captured component to said placement station; and means for placing said captured component at a selected position on a circuit board.

11. An apparatus as in claim 10, and further comprising:

means for holding said clamp arm open during movement of a carrier away from said pickup station in order to prevent any interference between said clamp arm and said pickup portion of said chip placement head.

12. An apparatus as in claim 10, and further comprising:
   means for detecting replacement component requirements;
   means for moving said conveyor nonintermittently to position at least one of said carriers at a corresponding feeder station according to said requirements, transferring a replacement component from said corresponding feeder station to said one carrier, and moving said conveyor non-intermittently to position said replacement component at said pickup station for subsequent picking up and transporting of said replacement component from said pickup station to said placement station and placing of said replacement component at a corresponding position on said circuit board.

13. A method of handling surface mountable electrical components according to a controller and in order to effect placement of said components at selected positions on a circuit board, and comprising the steps of:
   providing a turret assembly having a fixed hub with positive and negative air pressures supplied to grooves in an outer periphery thereof and a rotor rotatable about said hub and having corresponding positive and negative air ductwork communicating with said grooves, said rotor comprising plural chip placement assemblies each having a tubular spindle and a valving rod;
   indexing said rotor in a generally circular path of travel between a pickup station and a placement station cyclically;
   setting a valving rod of a particular chip placement assembly to a first position in order to block communication of said ductwork with said tubular spindle corresponding to said valving rod;
   presenting said particular chip placement assembly to said pickup station and moving said spindle to engage one of said components at said station;
   shifting said valving rod to a second position during said spindle moving in order to apply a vacuum to said spindle, via said negative ductwork, for pickup and transport of said component from said pickup station to said placement station;
   transporting and presenting said component to said placement station and moving said spindle toward said circuit board for depositing of said component at said selected position on said circuit board;
   shifting said valving rod to a third position during said depositing, in order to switch communication of said spindle from said negative to said positive air pressure via said ductwork and to positively disengage said component from said spindle during said depositing; and
   resetting said valving rod to said first position and again presenting said particular chip placement assembly to said pickup station.

14. A method as in claim 13, and further comprising the steps of:
   rotating said spindle to provide gross orienting of said component about a longitudinal axis of said spindle;
   orienting centering fingers of a centerer according to said gross orienting of said component; and
   engaging said fingers with said component and centering and squaring said component upon said longitudinal axis during holding of said component on said spindle.

15. A method as in claim 13, and further comprising the steps of:
   sensing a distance of travel of said spindle moving toward said circuit board, according to a thickness dimension of said component to be placed, whereby proper presentation of components of specifiable thicknesses is effectable;
   halting moving of said spindle toward said circuit board, upon not sensing a component dimension substantially equal to said thickness dimension, and thus aborting a chip placement step; and
   indexing said particular chip placement assembly to an eject station, prior to said resetting, shifting said valving rod to said third position and thus applying positive pressure to said spindle to eject any component from said spindle.

16. A method as in claim 13, and further comprising the step of:
   shifting a nozzle relative to a tip of said spindle according to said controller and prior to said pickup station in order to adjust a cross-sectional area for applying said vacuum to different sized components.

17. An apparatus for handling surface mountable electrical components according to a controller and in order to effect placement of said components at selected positions on a circuit board, and comprising:
   a turret assembly having a fixed hub with positive and negative air pressures supplied to grooves in an outer periphery thereof and a rotor rotatable about said hub and having corresponding positive and negative air ductwork communicating with said grooves, said rotor comprising plural chip placement assemblies each having a tubular spindle and a valving rod;
   means for indexing said rotor in a generally circular path of travel between a pickup station and a placement station cyclically;
   means for setting a valving rod of a particular chip placement assembly to a first position in order to block communication of said ductwork with said tubular spindle corresponding to said valving rod;
   means for presenting said particular chip placement assembly to said pickup station and moving said spindle to engage one of said components at said station;
   means for shifting said valving rod to a second position during said spindle moving in order to apply a vacuum to said spindle, via said negative ductwork, for pickup and transport of said component from said pickup station to said placement station;
   means for transporting and presenting said component to said placement station and moving said spindle toward said circuit board for depositing of said component at said selected position on said circuit board;
   means for shifting said valving rod to a third position, during said depositing, in order to switch communication of said spindle from said negative to said positive air pressure via said ductwork and to positively disengage said component from said spindle during said depositing; and
   means for resetting said valving rod to said first position and again presenting said particular chip placement assembly to said pickup station.

18. An apparatus as in claim 17, and further comprising:
- means for rotating said spindle to provide gross orienting of said component about a longitudinal axis of said spindle;
- means for orienting centering fingers of a centerer according to said gross orienting of said component; and
- means for engaging said fingers with said component and centering and squaring said component upon said longitudinal axis during holding of said component of said spindle.

19. An apparatus as in claim 17, and further comprising:
- means for sensing a distance of travel of said spindle moving toward said circuit board, according to a thickness dimension of said component to be placed, whereby proper presentation of components of specifiable thicknesses is effectable;
- means for halting moving of said spindle toward said circuit board, upon not sensing a component dimension substantially equal to said thickness dimension, and thus aborting a chip placement step; and
- means for indexing said particular chip placement assembly to an eject station, prior to said resetting, shifting said valving rod to said third position and thus applying positive pressure to said spindle to eject a component from said spindle according to said aborting.

20. An apparatus as in claim 17, and further comprising:
- means for shifting a nozzle relative to a tip of said spindle according to said controller and prior to said pickup station in order to adjust a cross-sectional area for applying said vacuum to different sized components.

21. An apparatus for transferring components between a loading station and an unloading station, and comprising:
- a transfer head having a nozzle means for holding a component by a vacuum;
- means for extending and retracting said transfer head selectively at said loading and unloading stations;
- means for pivoting said transfer head back and forth between said loading and unload stations;
- valve means, pivotal between negative, positive, and neutral positions, for applying air pressures to said nozzle means according to said extending, retracting, and pivoting of said transfer station; and
- means for pivoting said valve means at said loading and unloading stations.

22. An apparatus as in claim 21, and further comprising:
- means for detecting a displacement of said nozzle relative to said transfer head and sensing component presence and absence on said nozzle according to said detecting.

* * * * *